US012631974B2

(12) United States Patent (10) Patent No.: US 12,631,974 B2
Smorenburg et al. (45) Date of Patent: May 19, 2026

(54) ASSEMBLY FOR SEPARATING RADIATION IN THE FAR FIELD

(71) Applicant: ASML Netherlands B.V., Veldhoven (NL)

(72) Inventors: Petrus Wilhelmus Smorenburg, Veldhoven (NL); Johan Reinink, Uden (NL); Marinus Petrus Reijnders, Eindhoven (NL); Han-Kwang Nienhuys, Utrecht (NL); David O'Dwyer, Eindhoven (NL); Sander Bas Roobol, Veldhoven (NL); Christina Lynn Porter, Veldhoven (NL); Stephen Edward, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 240 days.

(21) Appl. No.: 18/277,188

(22) PCT Filed: Jan. 12, 2022

(86) PCT No.: PCT/EP2022/050490
§ 371 (c)(1),
(2) Date: Aug. 14, 2023

(87) PCT Pub. No.: WO2022/174991
PCT Pub. Date: Aug. 25, 2022

(65) Prior Publication Data
US 2024/0168392 A1 May 23, 2024

(30) Foreign Application Priority Data

Feb. 17, 2021 (EP) ..................................... 21157622
May 27, 2021 (EP) ..................................... 21176286

(51) Int. Cl.
*G21K 1/10* (2006.01)
*G03F 7/00* (2006.01)

(52) U.S. Cl.
CPC .... *G03F 7/706849* (2023.05); *G03F 7/70233* (2013.01); *G03F 7/70308* (2013.01); *G03F 7/70316* (2013.01); *G21K 1/10* (2013.01)

(58) Field of Classification Search
CPC .. H01S 3/0092; H01S 3/0323; G03F 7/70316; G03F 7/70308; G03F 7/70233; G03F 7/706849; G21K 1/10
See application file for complete search history.

(56) References Cited

U.S. PATENT DOCUMENTS

| 6,952,253 B2 | 10/2005 | Lof et al. |
| 6,992,306 B2 | 1/2006 | Honda et al. |
| | (Continued) | |

FOREIGN PATENT DOCUMENTS

| CN | 1305095 A | * | 7/2001 |
| CN | 101515105 B | | 7/2010 |
| | (Continued) | | |

OTHER PUBLICATIONS

Heckl, O.H., et al., "High harmonic generation in a gas-filled hollow-core photonic crystal fiber," Sep. 2009, Applied Physics B: Lasers and Optics, vol. 97, No. 2, pp. 369-373. (Year: 2009).*

(Continued)

*Primary Examiner* — David E Smith
*Assistant Examiner* — Hsien C Tsai
(74) *Attorney, Agent, or Firm* — Finnegan, Henderson, Farabow, Garrett & Dunner LLP

(57) ABSTRACT

An assembly and method for separating first radiation and second radiation in the far field, wherein the first radiation and the second radiation have non-overlapping wavelengths, The assembly comprises a capillary structure, wherein the (Continued)

first radiation and the second radiation propagate coaxially along at least a portion of the capillary structure, and an optical structure configured to control the spatial distribution of the first radiation outside of the capillary structure, through interference, such that the intensity of the first radiation in the far field is reduced along an optical axis of the second radiation.

15 Claims, 10 Drawing Sheets

(56) References Cited

U.S. PATENT DOCUMENTS

| | | | |
|---|---|---|---|
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 10,666,010 | B1 | 5/2020 | Nappi et al. |
| 2006/0066855 | A1 | 3/2006 | Boef et al. |
| 2006/0151724 | A1 | 7/2006 | Honda et al. |
| 2007/0224518 | A1 | 9/2007 | Yokhin et al. |
| 2010/0328655 | A1 | 12/2010 | Den Boef |
| 2011/0026032 | A1 | 2/2011 | Den Boef et al. |
| 2011/0102753 | A1 | 5/2011 | Van Der Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2016/0161863 | A1 | 6/2016 | Den Boef et al. |
| 2016/0225477 | A1 | 8/2016 | Banine et al. |
| 2016/0282282 | A1 | 9/2016 | Quintanilha et al. |
| 2016/0370717 | A1 | 12/2016 | Den Boef et al. |
| 2017/0184981 | A1 | 6/2017 | Quintanilha et al. |
| 2019/0003988 | A1 | 1/2019 | Solarz et al. |
| 2019/0215940 | A1 | 7/2019 | Khodykin et al. |

FOREIGN PATENT DOCUMENTS

| | | |
|---|---|---|
| EP | 1 628 164 A | 2/2006 |
| WO | WO 2011/012624 A1 | 2/2011 |
| WO | WO 2015/044182 A2 | 4/2015 |

OTHER PUBLICATIONS

Heckl, O.H., et al., "High harmonic generation in a gas-filled hollow-core photonic crystal fiber," Sep. 2009, Applied Physics B: Lasers and Optics, vol. 97, No. 2, pp. 369-373. (Year: 2009) (Year: 2009).*

International Search Report and Written Opinion of the International Searching Authority directed to International Patent Application No. PCT/EP2022/050490, mailed Jun. 24, 2022; 16 pages.

International Preliminary Report on Patentability directed to International Patent Application No. PCT/EP2022/050490, issued Aug. 22, 2023; 11 pages.

Berg-Johansen et al., "Classically entangled optical beams for high-speed kinematic sensing," Optica, vol. 2, No. 10, Aug. 27, 2018; pp. 1-9.

Chen et al., "Nonlinear optics in the $LP_{02}$ higher-order mode of a fiber," Optics Express, 21, No. 15, Jul. 29, 2013; pp. 17786-17799.

Ehrlich et al., "Corrugated Surface Antennas," IEEE, 1958 IRE International Convention Record, Mar. 21, 1966; 15 pages.

Elliott R. S., "On the Theory of Corrugated Plane Surfaces*," IEEE, Transactions of the IRE Professional Group on Antennas and Propagation, vol. 2, No. 2, Apr. 1954; pp. 71-81.

Flannery et al., "Implementing Bragg mirrors in a hollow-core photonic-crystal fiber," Optical Materials Express, vol. 7, No. 4, Mar. 10, 2017; pp. 1198-1210.

Gaudin et al., "Selection of a single femtosecond high-order harmonic using a zone plate based monochromator," Journal of Applied Physics, vol. 104, No. 3, Aug. 12, 2008; pp. 1-4.

Heckl et al., "High harmonic generation in a gas-filled hollow-core photonic crystal fiber," Applied Physics B: Lasers and Optics, vol. 97, No. 2, Oct. 14, 2009; pp. 369-373.

Marcatili et al., "Hollow Metallic and Dielectric Waveguides for Long Distance Optical Transmission and Lasers," Nokia Bell Labs, The Bell System Technical Journal, vol. 43, No. 4, Jul. 1964; 1783-1809.

Lemaillet et al., "Intercomparison between optical and x-ray scatterometry measurements of FinFET structures," Proc. SPIE, vol. 8681, Metrology, Inspection, and Process Control for Microlithography XXVII, Apr. 10, 2013; 8 pages.

\* cited by examiner

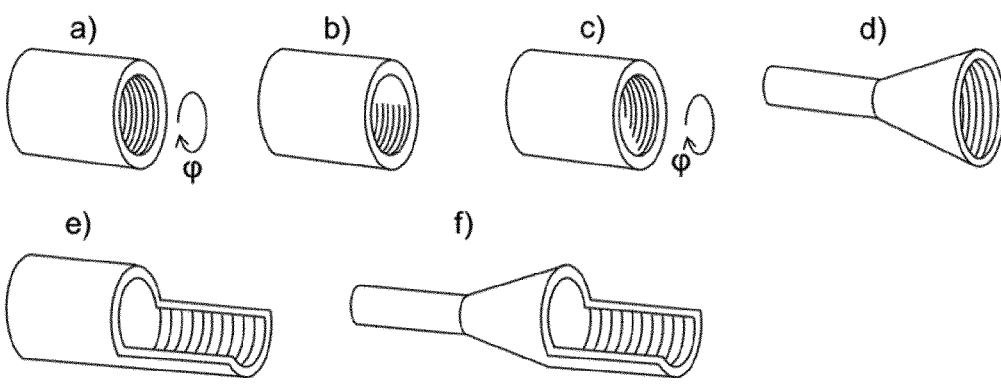
Fig. 9
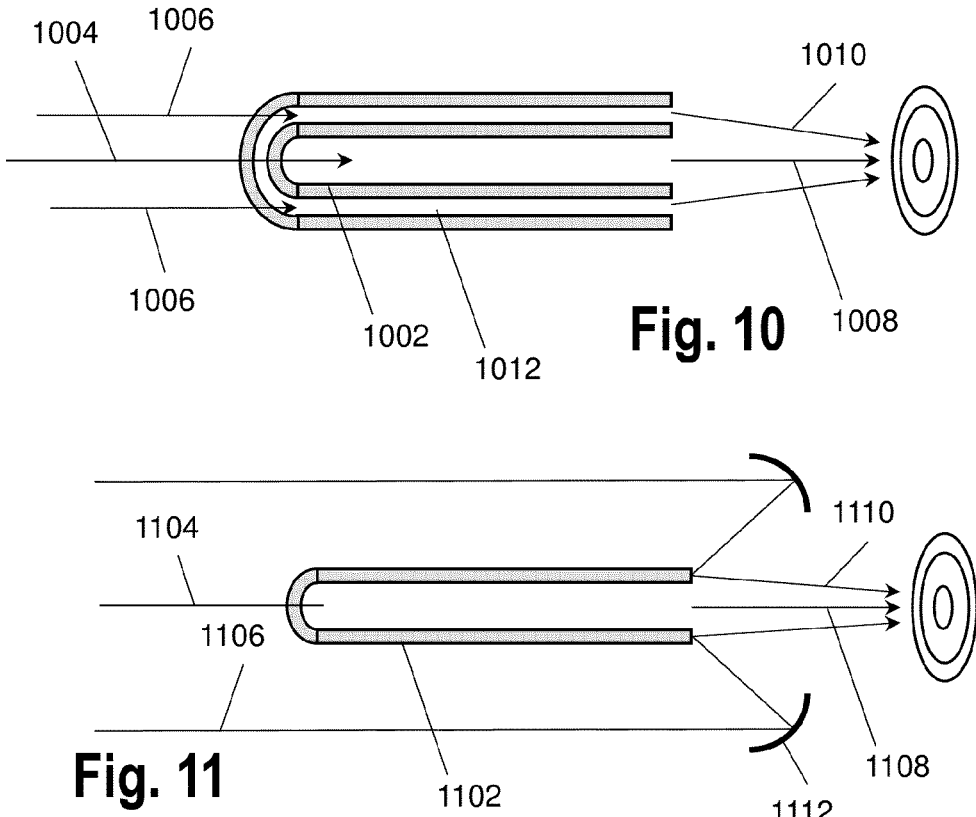

1402

1412(a)

1412(b)  1412(c)  ... 1412(N)

1520

0º

1530

1502

1506

1507

1514

α

1508

α

α

ASSEMBLY FOR SEPARATING RADIATION IN THE FAR FIELD

CROSS-REFERENCE TO RELATED APPLICATIONS

This application claims priority of EP application 21157622.8 which was filed on Feb. 17, 2021 and EP application 21176286.9 which was filed on May 27, 2021 which are incorporated herein in its entirety by reference.

FIELD

The present invention relates to assemblies, methods, and apparatus for separating radiation spanning different wavelength ranges. In particular, it relates to separating drive radiation and high harmonic generated radiation exiting from a gas capillary.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray" wavelength spectrum), it is possible to resolve smaller structures, to increase sensitivity to structural variations of the structures and/or penetrate further into the product structures. One such method of generating suitably high frequency radiation (e.g., soft X-ray and/or EUV radiation) may be using a pump radiation (e.g., infra-red radiation) to excite a generating medium, thereby generating an emitted radiation, optionally a high harmonic generation comprising high frequency radiation.

One example setup in which shorter wavelength radiation is generated using longer wavelength pump radiation uses a gas capillary fibre. The gas inside the capillary structure can acts as a generating medium, while the capillary may achieve high localized intensity of the pump radiation to enable high harmonic generation. The short wavelength radiation generated inside the gas capillary and the pump radiation both exit the capillary at an output end of the capillary. In order to use the short wavelength radiation, for example during metrology, it may be desirable to separate the short wavelength radiation from the pump radiation. The current disclosure aims to provide methods, assemblies, and apparatus to achieve improved separation of the pump and generated radiation.

SUMMARY

According to an aspect of the current disclosure, there is provided an assembly and method for separating first radiation and second radiation in the far field, wherein the first radiation and the second radiation have non-overlapping wavelengths. The assembly comprises a capillary structure, wherein the first radiation and the second radiation propagate coaxially along at least a portion of the capillary structure. The assembly further comprises an optical structure configured to control the spatial distribution of the first radiation outside of the capillary structure, through interference, such that the intensity of the first radiation in the far field is reduced along an optical axis of the second radiation.

Optionally, the optical structure may be configured to cause interference of the first radiation such that it forms an annular beam.

Optionally, the optical structure may be provided in a portion of the capillary structure for guiding the first radiation and the second radiation.

Optionally, the optical structure may be located in an end section located towards an output end of the capillary structure Optionally, controlling the spatial distribution in the far field may comprise selecting the properties of at least one of a material and a shape of the optical structure so as to support the propagation of modes of the first radiation having a distribution where an average of the electric field is zero over a cross-section of the capillary structure.

Optionally the optical structure may comprise a Bragg grating configured to reflect the first radiation in a direction away from the output end of the capillary structure.

Optionally, the Bragg grating may be a gradual Bragg grating.

Optionally, the optical structure may comprise a corrugated section added after an output end of the capillary structure.

Optionally, the optical structure may comprise one or more optical elements configured to split the first radiation before it enters the capillary structure, such that a first portion of first radiation propagates through the capillary structure, and a second portion of first radiation bypasses the capillary structure; and interfere the first and second portions of first radiation once the first portion has propagated through the capillary structure.

Optionally, the one or more optical elements may comprise an annular structure around the capillary structure configured to guide the second portion of first radiation bypassing the capillary structure.

Optionally, the one or more optical elements may be arranged such that a path length of the first portion of first radiation and the second portion of the first radiation match at the location where they interfere.

Optionally, the optical structure may comprise a Brewster plate configured to suppress reflection of the first radiation while reflecting at least a portion of the second radiation.

Optionally, the optical structure may comprise a conical mirror located in the path of the first radiation after it exits the capillary structure. The conical mirror may be configured such that the first radiation interferes destructively with itself along an optical axis of the second radiation.

Optionally, the optical structure may cause interference of the first radiation such that it diffracts into a direction (forms a skewed beam) which is different from the optical axis of the second radiation.

According to another aspect of the current disclosure there is provided an assembly and method for separating first radiation and second radiation in the far field, wherein the first radiation and the second radiation have non-overlapping wavelengths. The assembly comprises a capillary structure, wherein the first radiation and the second radiation propagate coaxially along at least a portion of the capillary structure. The assembly further comprises an optical structure configured to control the spatial distribution of the first radiation outside of the capillary structure, through diffraction, such that the intensity of the first radiation in the far field is reduced along an optical axis of the second radiation.

Optionally, the optical structure may comprise a series of diffracting apertures configured to absorb portions of the first radiation diffracted into the regions between the diffracting apertures such that the intensity in the far field is reduced by a factor in a range from 10 to 1000.

Optionally, the capillary structure may be configured to receive the first radiation, at an input end of the capillary structure; and generate, using the first radiation as drive radiation, the second radiation using high harmonic generation.

Optionally, the capillary structure may comprise a hollow core fibre configured to hold a gas medium.

Optionally, the gas medium may comprise at least one of $H_2$, Ne, He, Ar, $N_2$, $O_2$, Kr, Xe.

Optionally, the second radiation may comprise radiation with one or more wavelengths in a range from 1 nm-180 nm.

Optionally, the first radiation may comprise radiation with one or more wavelengths in a range of 200 nm to 10 μm.

According to another aspect of the current disclosure, there is provided a radiation source comprising an assembly according to any of the preceding claims.

According to another aspect of the current disclosure, there is provided a lithographic apparatus comprising a radiation source as described above.

According to another aspect of the current disclosure, there is provided a metrology apparatus comprising a radiation source as described above.

According to another aspect of the current disclosure there is provided a litho cell comprising a radiation source as described above.

BRIEF DESCRIPTION OF THE DRAWINGS

Embodiments will now be described, by way of example only, with reference to the accompanying schematic drawings, in which:

FIG. 8(*a*) depicts an annular spatial profile, and FIG. 8(*b*) depicts a skewed spatial profile;

FIGS. 9(*a*) to (*f*) depict schematic representations of example embodiments of corrugated sections causing a reduction of drive radiation intensity on axis in the far field;

FIG. 10 depicts a schematic representation of an example setup of bypassing a portion of drive radiation by the capillary structure, using a concentric annular channel;

FIG. 11 depicts a schematic representation of an example setup of bypassing a portion of drive radiation by the capillary structure in free space using optical elements;

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
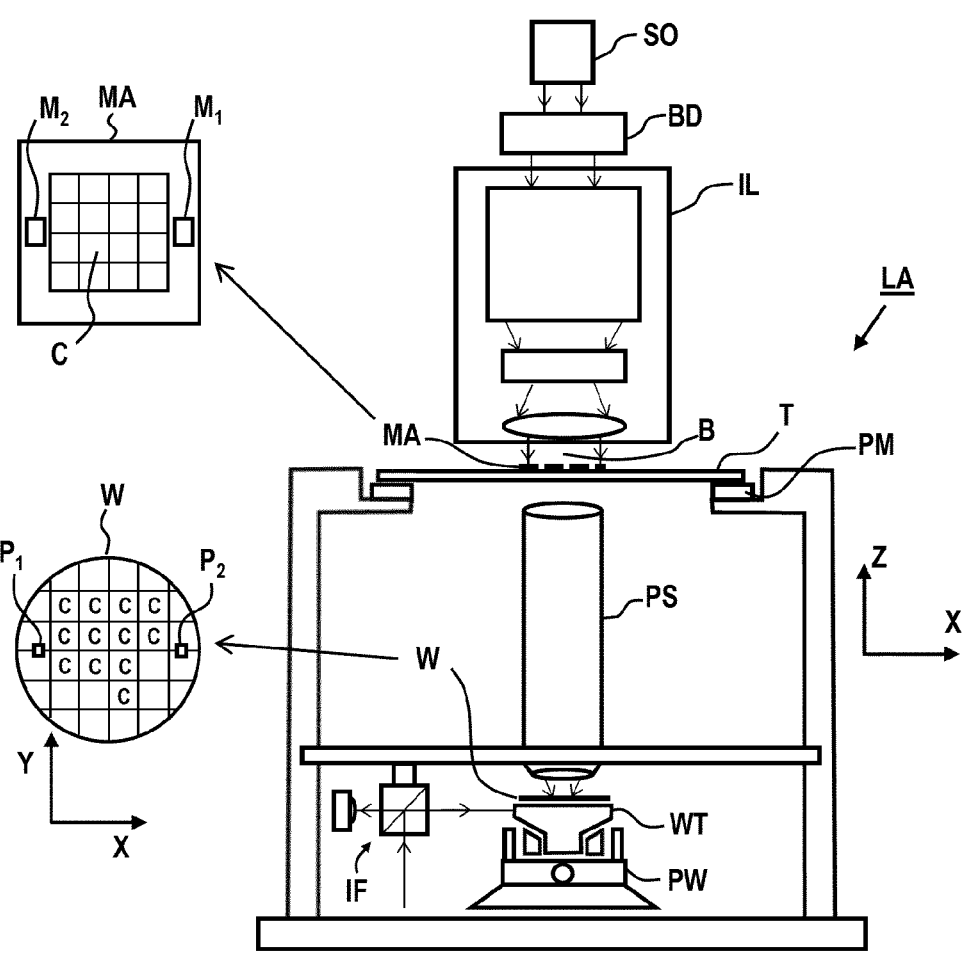
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figures 2, 3:
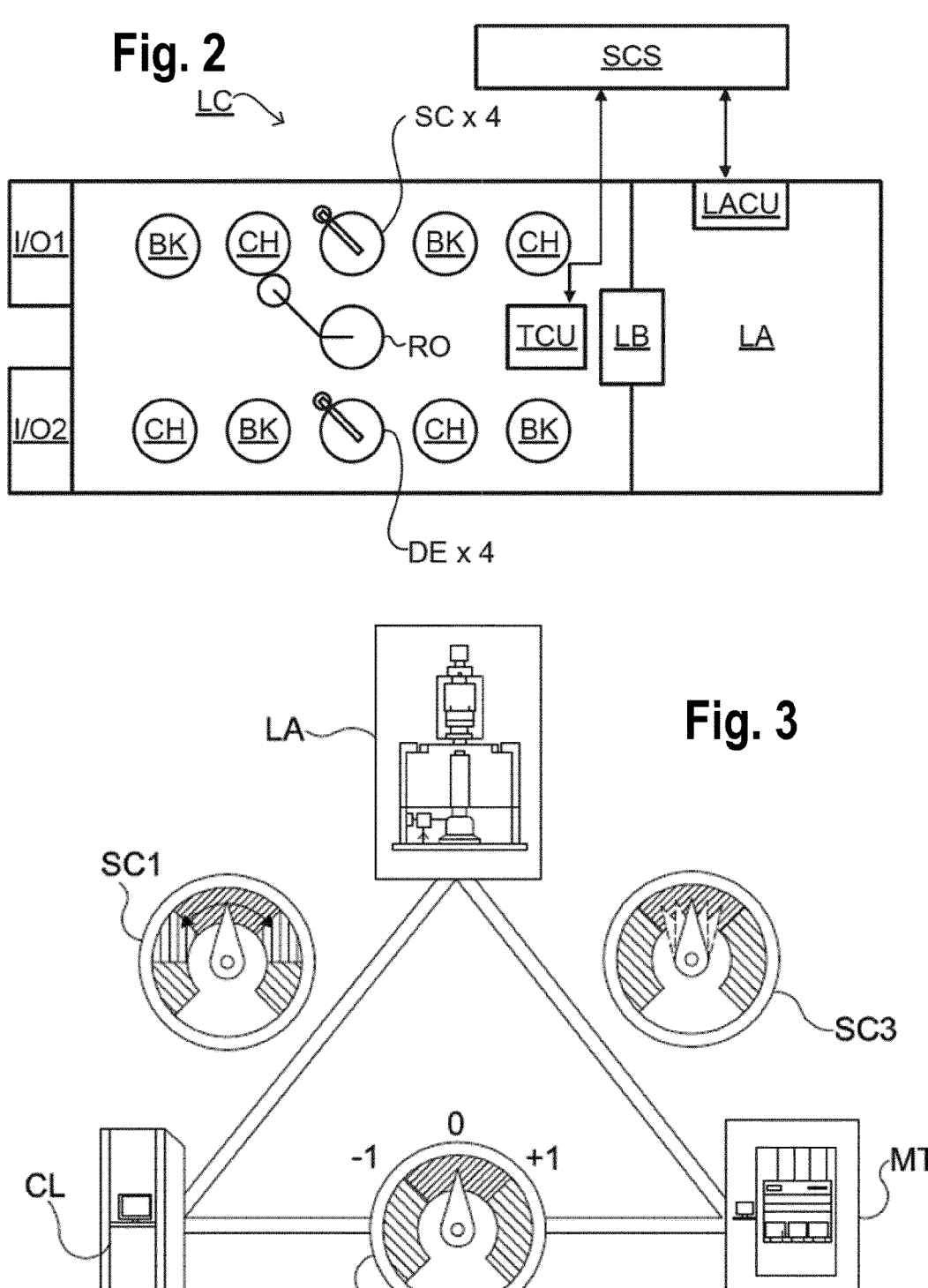
FIG. 2 depicts a schematic overview of a lithographic cell.
FIG. 3 depicts a schematic representation of holistic lithography, representing a cooperation between three key technologies to optimize semiconductor manufacturing.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray, soft X-ray, extreme ultraviolet and visible to near-IR wavelength range. In case that the radiation is hard X-ray or soft X-ray, optionally with a wavelength ranging from 0.01 to 10 nm, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations.

More examples are described in US patent application US2016-0161863 and published US patent application US 2016/0370717A1 incorporated herein by reference in its entirety.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from hard X-ray, soft X-ray, extreme ultraviolet and visible to near-IR wave range.

Figure 4:
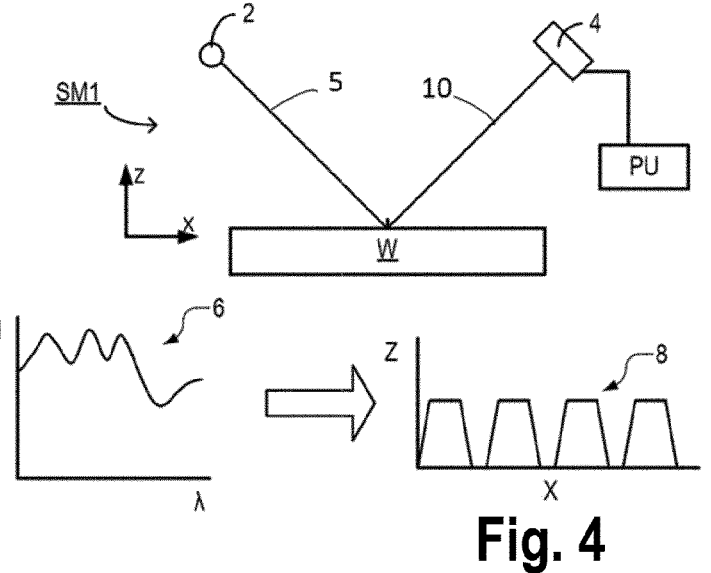
FIG. 4 schematically illustrates a scatterometry apparatus.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength λ) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use hard X-ray, soft X-rays or EUV radiation, for example radiation in a wavelength range between 0.01 nm and 100 nm, or optionally between 0.01 nm and 50 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. It is noted that the use of laser produced plasma (LPP) x-ray source is described in U.S. Patent Publication No. 2019/003988A1, and in U.S. Patent Publication No. 2019/215940A1, which are incorporated herein by reference in the entirety. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques may be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

In a transmissive version of the example of a metrology apparatus, such as a scatterometer, the transmitted radiation is passed to a spectrometer detector, which measures a spectrum as discussed above. Such a scatterometer may be configured as a normal-incidence scatterometer or an oblique-incidence scatterometer. Optionally, the transmissive version using hard X-ray radiation with wavelength <1 nm, optionally <0.01 nm.

It is possible that the range of application makes the use of wavelengths in e.g. the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent application are incorporated herein by reference in their entirety.

Figure 5:
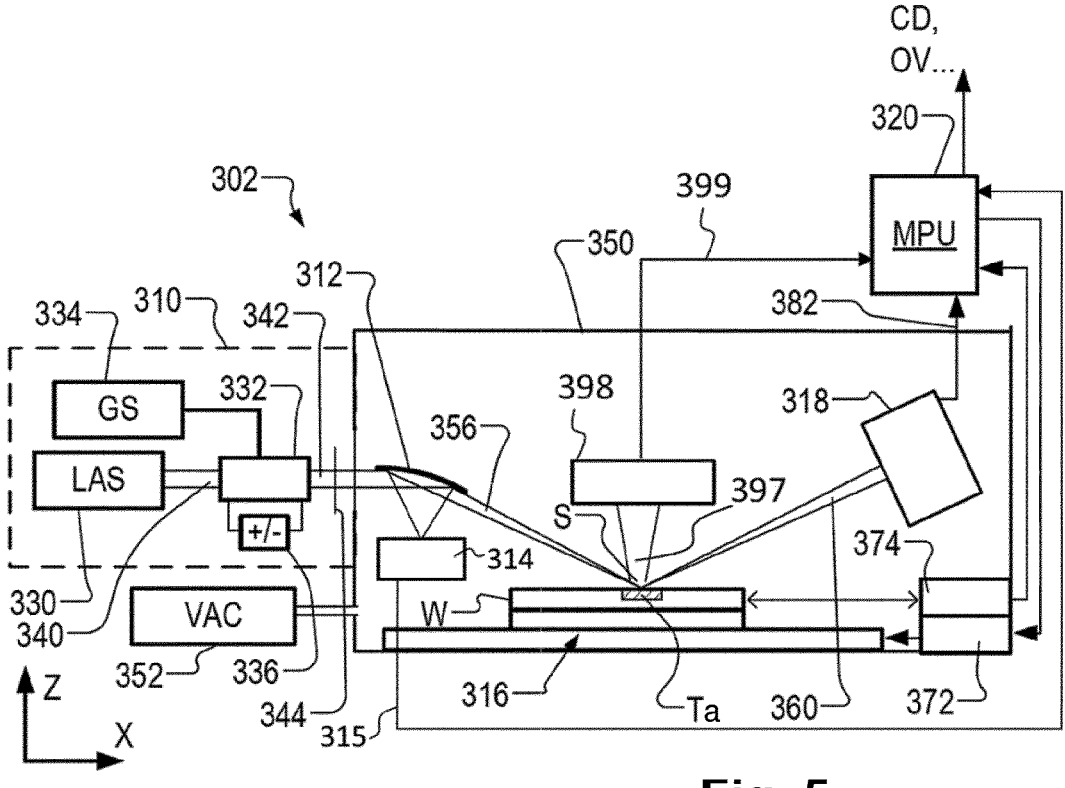
FIG. 5 depicts a schematic representation of a metrology apparatus in which EUV and/or SXR radiation is used.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV or soft x-ray radiation, which may be based on high harmonic generation (HHG) techniques. Main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. A gas provided by the gas delivery system 332 defines a gas target, which may be a gas flow or a static volume. The gas may be for example a noble gas such as neon (Ne), helium (He) or argon (Ar). N2, O2, H2, Ar, Kr, Xe gases may all be considered. The delivery system 322 may provide a single gas or a mixture of gases. If a mixture of gases is provided as the gaseous medium, the gases may be provided by the gas delivery system as a mixture, or as separate gases, to be mixed after delivery. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated. Some or all of the beam path may be contained within a vacuum environment, bearing in mind that SXR radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 may enter an inspection chamber 350 where the substrate W including a structure of interest is held for inspection at a measurement position by substrate support 316. The structure of interest is labeled T. The atmosphere within inspection chamber 350 may be maintained near vacuum by vacuum pump 352, so that generated high harmonic radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 lam in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). One of the challenges faced in the development of these sources is how to couple the emitted radiation out of the generating setup efficiently and separate the emitted radiation from the radiation used to drive the process.

Figure 6:
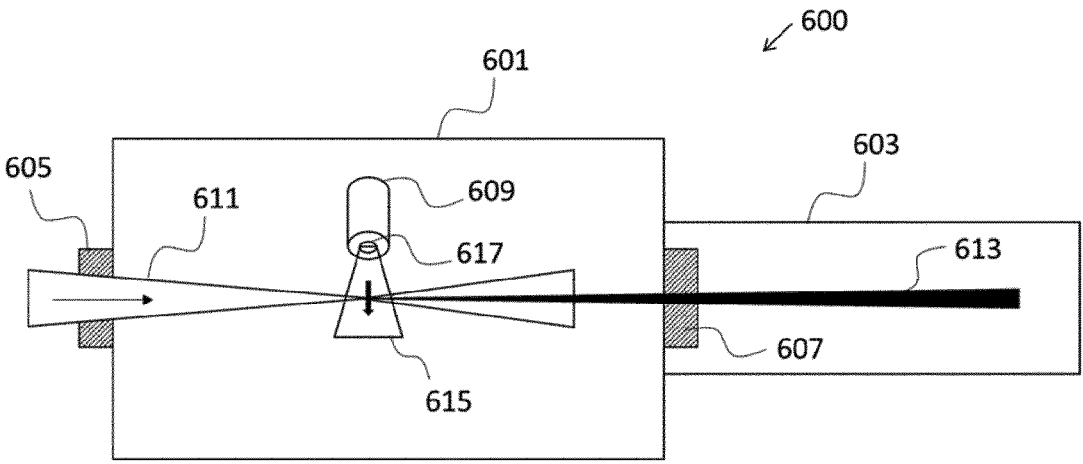
FIG. 6 represents a schematic representation of an illumination source.

FIG. 6 shows a simplified schematic drawing of an embodiment 600 of an illumination source 310, which may be the illumination source for high harmonic generation. One or more of the features of the illumination source in the metrology tool described with respect to FIG. 5 may also be present in the illumination source 600 as appropriate. The illumination source 600 may comprise a chamber 601. The illumination source 600 is configured to receive a pump radiation 611 with a propagation direction which is indicated by an arrow. The pump radiation 611 shown here is an example of the pump radiation 340 from the pump radiation source 330, as shown in FIG. 5. The pump radiation 611 may be directed into the chamber 601 through the radiation input 605, which maybe a viewport which may be made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 615 may be a steady flow. Other media, such as metallic plasmas (e g aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 615 is provided by the gas delivery system into an evacuated or nearly evacuated space. The gas delivery system comprises a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup may be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 5. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 5, to a wafer to be inspected for metrology measurements. The emitted radiation 613 may be guided, optionally focused, to a target on the wafer.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 5 into the radiation output 607, which is placed in the emitted beam path and that is opaque or nearly opaque to the driving radiation (e.g. opaque or nearly opaque to infrared or visible light) but at least partially transparent to the emitted radiation beam. The filter may be manufactured using zirconium. The filter may be a hollow, optionally an annular, block when the pump radiation 611 has a hollow, optionally an annular, transversal cross-sectional profile.

Described herein are methods, apparatuses, and assemblies to obtain emitted radiation optionally at a high harmonic frequency of pump radiation. The radiation generated through the process, optionally the HHG which uses nonlinear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultraviolet (EUV), soft X-Ray (SXR), and/or hard X-Ray (HXR) part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV and/or SXR wavelengths as comprised in the wavelength ranges described above, may allow for smaller features of a structure to be resolved by the metrology tool, compared to using longer wavelengths (e.g. visible radiation, infrared radiation). Radiation with shorter wavelengths, such as EUV and/or SXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV and/or SXR radiation. The target structure may reflect and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected radiation (0th order diffracted radiation). Further sensors for metrology may be present in the metrology tool MT, for example to measure further diffraction orders (e.g. higher diffraction orders).

Metrology tools MT may use short wavelength radiation, such as radiation in the UV, UV, EUV, and SXR radiation. Radiation may for example be in the range of 0.1 nm to 100 nm, 1 nm to 100 nm, or 1 nm to 10 nm. This radiation may be provided by an illumination source such as the one described in relation to FIG. 6. The illumination source may use a high harmonic generation process to obtain the short wavelength radiation. In high harmonic generation (HHG), an intense laser radiation pulse of pump radiation, also referred to as drive radiation, may be shot into a gaseous medium, which may also be referred to as a gas target. This may cause the gas particles to emit short wavelength radiation due to their interaction with the intense pump radiation. The pump radiation may have wavelengths in the visible or infrared parts of the electromagnetic spectrum. In an example lithographic metrology application, the HHG generated radiation may be focused onto a target on the substrate using an optical column, which may be referred to as an illuminator, which transfers the radiation from the HHG source to the target. The HHG radiation may then be reflected from the target, detected and processed, for example to measure and/or infer properties of the target.

Gas target HHG configurations may be broadly divided into two separate categories: gas jets and gas capillaries. FIG. 6 depicts an example gas jet configuration in which as gas volume is introduced into a drive radiation laser beam. In a gas jet configuration, interaction of the drive radiation with solid parts is kept to a minimum. The gas volume may for example comprise a gas stream perpendicular to the drive radiation beam, with the gas volume enclosed inside a gas cell. In a gas capillary setup, the dimensions of the capillary structure holding the gas are small in a lateral direction such that it significantly influences the propagation of the drive radiation laser beam. The capillary structure may for example be a hollow-core fibre, wherein the hollow core is configured to hold the gas. A gas jet HHG configuration may offer a relative freedom to shape a spatial profile of the drive radiation beam in the far field, as it is not confined by the restrictions imposed by the gas capillary structure. Gas jet configurations may also have less stringent alignment tolerances. On the other hand, a gas capillary may provide an increased interaction zone of the drive radiation and the gaseous medium, which may optimise the HHG process.

In order to use the HHG radiation, for example in a metrology application, it is separated from the drive radiation downstream of the gas target. The separation of the HHG and drive radiation may be different for the gas jet and gas capillary configurations. In both cases, the drive radiation rejection scheme can comprise a metal transmissive filter for filtering out any remaining drive radiation from the short wavelength radiation. However, before such a filter can be used, the intensity of the drive radiation should be reduced significantly from its intensity at the gas target, in order to avoid damage to the filter. The methods that can be used for this intensity reduction differ for the gas jet and capillary configurations. For a gas jet HHG, due to the relative freedom of the shape and spatial profile (which may also be referred to as a spatial distribution, and/or spatial frequencies) of the drive radiation beam focussed onto the gas target, this can be engineered such that in the far field it has a low intensity along the directions where the short wavelength radiation propagates. This spatial separation in the far field means an aperture may be used to block the drive radiation and lower its intensity In contrast, in a gas capillary structure, the spatial profile of the beam as it passes through the gaseous medium may be largely dictated by the capillary. The spatial profile of the drive radiation may be determined by the shape and material of the capillary structure. For example, in the case of a hollow-core fiber being used as a capillary structure, the shape and materials of the fiber structure determine which modes of drive radiation are supported for propagation through the fiber. For most standard fibres, the supported propagating modes lead to a spatial profile where the high intensity of the drive radiation overlaps with the high intensity of the HHG radiation. For example, the drive radiation intensity may be centred, in a Gaussian or close-to-Gaussian profile in the far field.

As drive radiation and HHG radiation exit from a capillary structure such as an optical fibre, they may be coaxially propagating with spatial profiles that maintain significant overlap in the far field. Described herein are methods and assemblies to achieve spatial separation of the drive radiation and the HHG radiation, such that the drive radiation can be blocked, and the HHG radiation can be provided for a desired purpose. Although described herein in relation to drive radiation and HHG radiation, the methods and assemblies described herein can be more generally applied to achieve spatial separation of coaxially propagating first radiation and second radiation, wherein the first and second radiation have non-overlapping wavelengths/wavelength ranges, for example but not limited to in gas jet HHG setups.

Figure 7:
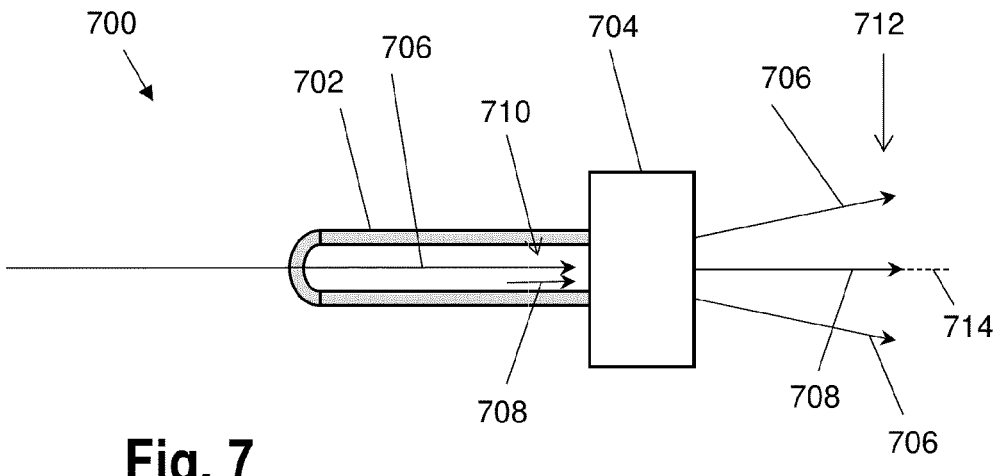
FIG. 7 depicts a schematic representation of an assembly for separating first radiation and second radiation in the far field.

FIG. 7 depicts a schematic representation of an assembly 700 for separating first radiation 706 and second radiation 708 in the far field. The first and second radiation have non-overlapping wavelengths, and may for example by drive radiation and HHG radiation. The assembly comprises a capillary structure 702, wherein the first and second radiation propagate coaxially 710 along at least a portion of the capillary structure 702. The assembly further comprises an optical structure 704 configured to control the spatial profile (i.e. spatial distribution) of the first radiation in the far field, outside of the capillary structure. The optical structure achieves control of the spatial profile of the first radiation using interference. The interference causes the intensity of the first radiation in the far field 712 to be reduced along an optical axis 714 of the second radiation such that the first radiation is substantially separated from the second radiation in the far field 712.

An advantage of the assembly described above is that the use of interference is wavelength-dependent. As the first and second radiation have non-overlapping wavelengths, it is therefore possible to control the first radiation separate from any overlapping second radiation. This allows the optical structure to make drive radiation interfere with other drive radiation to separate it from the HHG radiation.

In a gas capillary high harmonic generation configuration, the drive radiation and HHG radiation may substantially overlap inside the gas capillary in which the HHG radiation is generated. The drive radiation and HHG radiation may propagate in substantially the same direction inside the capillary before the optical structure is reached. The optical structure may achieve a spatial separation of drive radiation from the HHG radiation in the far field, by controlling the spatial distribution of the radiation. As the drive radiation propagates away, this constitutes a Fourier transform of the drive radiation, wherein the frequencies transformed by the Fourier transform correspond to the directions of the radiation. The spatial frequencies, which represent the directions in which radiation propagates, determine the spatial profile of the radiation in the far field. The spatial frequencies may be modified so that they have no or low overlap with the spatial distribution of the HHG radiation in the far field.

Figure 8A:
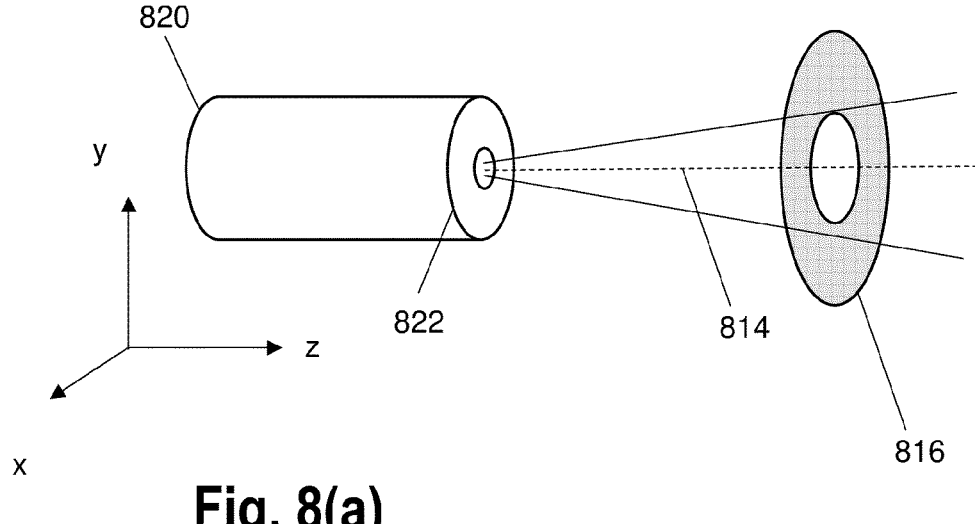
FIG. 8 depicts schematic representations of example spatial distributions of the drive radiation in the far field.
Figure 8B:
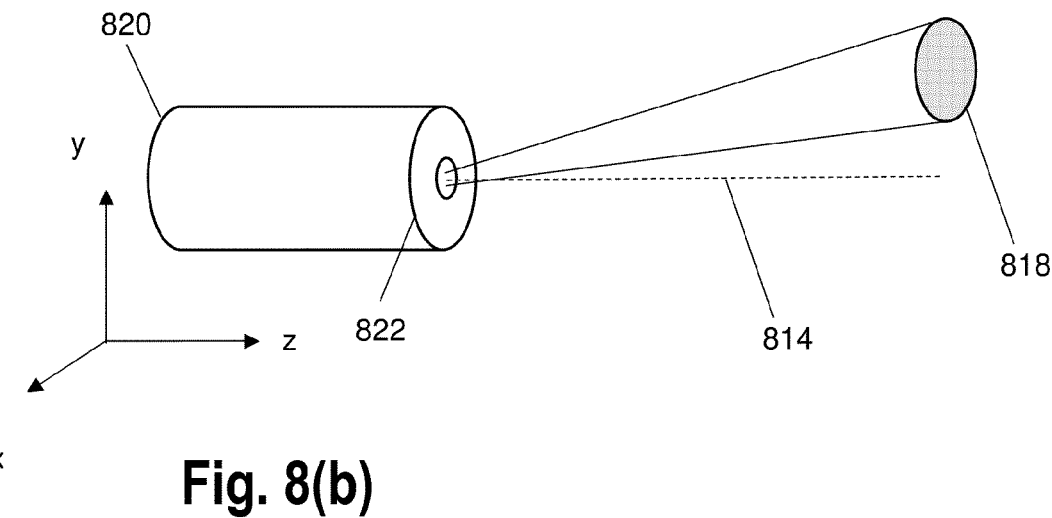

FIG. 8 depicts example spatial distributions of the drive radiation in the far field. In FIG. 8(a), and annular spatial profile 816 is achieved, around an optical axis 814 of the HHG radiation. In FIG. 8(b) the drive radiation is skewed away from the optical axis 814 of the HHG radiation, in one or more preferential directions 818. In an example implementation, the HHG radiation may propagate along a straight optical axis 814. The axis may be referred to as the z-direction, or z-axis. The intensity of the HHG radiation may be concentrated around the spatial frequency along the z-direction, with direction $(x, y, z)=(0, 0, 1)$. The modification of spatial distribution performed by the optical structure may result in the drive radiation having a spatial profile where the intensity along the $(0, 0, 1)$ direction is set to zero, or significantly reduced.

In some implementations, the optical structure may form part of the capillary structure. The capillary structure may have an input end 820 and an output end 822, wherein input and output are defined relative to the direction of propagation of the drive and HHG radiation. The drive radiation may be coupled into the capillary structure at the input end 820. The HHG radiation may be generated inside the gaseous capillary structure, at a location inside the capillary structure where a high intensity of drive radiation is present. The HHG radiation exits the capillary structure at the output end 822. The optical structure may be present between the location where the HHG radiation is generated, and the output end 822 of the capillary structure.

In order to achieve the optical structure as part of the capillary structure, the geometry of the capillary structure may be modified so that it supports the propagation of a mode that leads to an annular drive radiation beam in the far field, after it exits from the output end 822 of the capillary structure. The modified capillary forming the optical structure does not affect the mode of the HHG radiation in the same way, meaning the spatial distribution of the HHG radiation may keep a spatial profile with a peak intensity around the $(x, y)=(0, 0)$. Once the annular drive radiation shape is achieved, rejection of the drive radiation may be accomplished using an aperture. The aperture may block the annular drive radiation while allowing the HHG radiation to pass through the aperture.

The spatial intensity profile in the far field of radiation exiting the capillary structure may be dependent on the spatial frequencies representing the directions of the radiation at the output end 822 of the capillary structure. The relation can be expressed as a Fourier transform, as follows:

$$\vec{E}_{\mathit{ff}}(\theta_x,\theta_y) \propto \iint \vec{E}_{\mathit{nf}}(x,y)\exp(ikx\theta_x+iky\theta_y)dxdy \qquad (1.1)$$

where Eff is the electric field in the far field, Enf is the electric field at the end of the capillary, k is the wavenumber corresponding to the drive laser wavelength. The coordinates x, y are along the x and y axes as set out in FIG. 8. $\theta$x, $\theta$y represent angles between the direction (i.e. a spatial frequency) of the radiation and the optical axis 814. In order to determine which spatial distributions at the output end 822 of the capillary structure lead to an annular intensity profile in the far field, the equation (1.1) above may be evaluated along the optical axis ($\theta$x=$\theta$y=0), with a requirement that the far field is zero there. This may result in a condition for drive radiation inside the optical structure portion of the capillary:

$$\vec{E}_{ff}(\theta=0) \propto \iint \vec{E}_{nf}(x,y) dx dy = 0 \qquad (1.2)$$

Condition 1.2 may be met when the electric field averaged over the cross section of the capillary is zero, so that an annular beam is obtained in the far field. The conditions that may be satisfied by the mode of the drive radiation in the capillary structure may further include one or more of the following: inside the optical structure portion of the capillary structure, the electric field averaged over the cross section may be zero. The electric field may peak at the centre of the capillary. This central peak may be to efficiently generate harmonics, for HHG radiation generation. The dispersion of the mode of drive radiation may be sufficiently low to transport the laser pulse without causing significant pulse lengthening, despite the large bandwidth of the laser pulse. The attenuation of the mode may be sufficiently low to limit losses of laser power along the propagation of the laser pulses along the capillary. In this instance, sufficiently low may be a criterion set depending on the requirements and tolerances of the application.

The shape and/or materials of the capillary may be selected in order to achieve a spatial distribution of drive radiation inside the optical structure portion of the capillary. One option may be to use an ordinary cylindrical hollow capillary. Such capillaries admit an infinite number of discrete modes. Some modes can be tailored to meet some or all of the conditions above. For example, mode HE12 and/or mode LP02 may be tailored to satisfy the conditions listed above. Having an electric field that peaks at the centre of the capillary may be intrinsically satisfied by the shape of the mode. Having an electric field that averages to zero over a cross-section of the capillary may be fulfilled by manipulating the boundary conditions for the field at the capillary wall. This may for example be done by choosing a suitable wall material.

Achieving low dispersion to avoid pulse lengthening, achieving low attenuation to limit losses inside the capillary, and controlling the phase velocity of radiation inside the capillary may all depend to a large extent on the optical properties of the wall material. Therefore it may be possible to design a capillary that also satisfies these conditions by composing the wall from layers of different materials with advantageously chosen optical properties. Although the use of higher-order modes is often discarded with the argument that they exhibit a high attenuation in hollow dielectric waveguides, by selecting materials with suitable properties, the achieves attenuation may be kept sufficiently low for the requirements of the application. For example, a laser pulse with 1 μm wavelength can propagate in the LP02 mode through a 50 μm radius capillary with only 17% loss per cm, versus 3% loss per cm for the fundamental mode.

Next to a cylindrical hollow capillary as described above, a second option is to use a hollow-core photonic crystal fiber (HC-PCF), which is a capillary with a material microstructure added to the inner wall. Several examples of HC-PCF microstructure patterns are known in the art. The optical properties of such HC-PCFs may be tuned over a large range by suitably designing the pattern of the microstructure. Therefore, a fiber may be designed that fulfils some or all of the conditions above. In one example, a HC-PCF may be designed such that the dispersion is zero for the LP02 mode inside the capillary.

One difficulty in using a higher-order mode such as the LP02 mode may be to make sure this is the mode that gets coupled into when focusing a laser beam into a capillary. This is because a usual Gaussian laser beam may tend to couple mainly to the LP01 mode of the capillary which has an intensity profile similar to a Gaussian beam. For a cylindrical capillary, coupling to the higher order mode may be achieved by spatially shaping the focused laser beam to have an intensity profile similar to the desired higher order mode inside the capillary. This may for example be done using a beam shaping device such as an arrangement comprising for example axicon lenses, one or more deformable mirrors, one or more freeform transmissive optical elements, one or more fixed freeform mirrors, a spatial light modulator, etc. In case of HC-PCFs, it may be possible to first excite the LP01 mode at the entrance of the capillary, and then convert the LP01 mode to a higher-order mode using a mode converter section in which the microstructure gradually changes.

The optical structure controlling a mode of the radiation inside the capillary may be present along all of the capillary. In other implementations, the capillary may have a first portion towards the input end of the capillary, and a second portion towards the output end of the capillary. The first portion may be for generating the HHG radiation from the drive radiation. The second portion may comprise the optical structure for controlling the mode of the drive radiation to achieve separation of drive radiation and HHG radiation in the far field.

In an example implementation, the optical structure present in the second portion of the capillary structure, may comprise a Bragg grating. The Bragg grating may be configured to reflect the drive radiation back away from the output end of the capillary structure. In order to reflect drive radiation, the grating pitch may be set to an integer multiple of half the wavelength of the drive radiation. This causes radiation at this wavelength to interfere constructively in a backward propagating direction, towards the input end of the capillary structure. The pitch also causes radiation to interfere destructively in the forward propagating radiation, towards the output end of the capillary structure. This leads to a reductions in the intensity of the drive radiation exiting the output end, and causes separation of the drive radiation and the HHG radiation in the far field. The drive radiation may for example be reflected back to the input end of the capillary structure.

As the pitch of the Bragg grating is set for drive radiation wavelengths, the HHG radiation is not reflected, and may propagate to the output end of the capillary structure. A potential concern may be that the reflected drive radiation pulse may negatively affect the generated HHG radiation. However, for typical pulse lengths in HHG sources (for example pulse lengths of the order of 10 μm), the pulse is so short that the interaction of the forward pulse with the gaseous medium inside the capillary structure has already finished by the time the backwards reflected drive radiation pulse arrives. Therefore, the reflected pulse is not problematic. The backwards reflected drive radiation pulse may generate a secondary HHG radiation pulse in the backwards direction, propagating towards the input end of the capillary structure. An optical assembly may be provided to prevent the backwards reflected pulse to enter into the drive radiation source system.

A possible challenge may be that a Bragg grating may be wavelength-selective, and may not reflect the full wavelength range of the drive radiation, and as a result be less effective at reducing the intensity of drive radiation exiting the output end of the capillary structure. To overcome this challenge, the Bragg gating may be a gradual Bragg grating, in which the pitch, also referred to as periodicity, of the Bragg grating is gradually varied, to reflect a wider range of wavelengths. A gradual Bragg grating may also be referred to as a chirped Bragg grating.

In a hollow cylindrical fibre, a Bragg grating may take the shape of a diffraction grating provided on the inner wall of the optical structure. A Bragg grating can also be applied to a HC-PCF, for example as described in Flannery et al, Opt. Mat. Express 7, 2017.

The optical structure may comprise one or more structures that are separate from the capillary structure in addition to, or as an alternative to, an optical structure forming part of the capillary structure. The optical structure may comprise a corrugated section. The corrugated section may be added in a second portion towards the output end of the capillary, or may be added just after the output end of the capillary structure. The radiation pattern of the radiation beam exiting from a capillary structure may be modified by shaping the end section of the capillary structure and/or adding corrugations.

In an example implementation, a bottom surface of the optical structure has been corrugated. The optical structure may protrude some distance after the output end of the capillary structure. The dimensions/pitch of the corrugations may be set so that the radiation peak of the drive radiation is shifted away from the optical axis of the HHG radiation. This may modify the far field radiation pattern of the drive radiation beam exiting the capillary.

FIGS. 9(a) to (f) depict several example embodiments of corrugated sections causing a reduction of drive radiation intensity on axis in the far field. FIG. 9(a) depicts an example capillary with cylindrically symmetric corrugations. With dimensions set to interact with the drive radiation, this structure may result in an annular drive radiation beam in the far field. An advantage of cylindrically symmetric corrugations, is that they may be easier for manufacturing than structures with corrugations only on part of the capillary. In FIG. 9(b) corrugations have only been added to the bottom half of the optical structure. This may lead to an asymmetric radiation pattern with the peak skewed/tilted away from the optical axis. In FIG. 9(c) the length of corrugated surface on the optical structure gradually varies as function of azimuth $\varphi$, i.e. different sides of the inner wall of the optical structure may have a different number of corrugations. Since in general the presence of corrugations in a waveguide tends to decrease the phase velocity of the guided radiation, this geometry may lead to a drive radiation wavefront that has been delayed by different amounts at different azimuths. The result may be a conversion to one or more modes with an azimuthal phase variation that may be similar to a TE01 mode in the capillary structure. The radiation pattern of such a mode may feature a zero or near-zero intensity on the optical axis. An annular beam may be created. FIG. 9(d) depicts an example structure comprising a capillary tapered into a conical horn. This structure may be easier to fabricate, and it may increase the drive radiation divergence angle. FIGS. 9(e) and 9(f) depict example semi-circular structures leading to a far field beam which may be skewed and peaked off axis.

The corrugations may be physical corrugations. Alternatively or additionally, the variation the optical structure may be provided by using materials with significantly different optical properties. Such material-property based corrugations may be provided for any of the example setups depicted in FIGS. 9(a) to (f).

The scaling of the corrugations may comprise dimensions of a sub-wavelength scale. Such sub-wavelength corrugations may for example comprise sub-micrometer pitched diffraction gratings fabricated on capillary surfaces. However, the corrugations may also cause off-axis constructive interference based on grazing incidence, which may be less dependent or independent on the pitch of the corrugations Therefore, a plane with aperiodic scattering centers, such as a roughened plate, may be provided, This plane may result in directing the drive radiation beam off axis.

The corrugations may impact the phase velocity of the propagating drive radiation beam in the optical structure. In a case where the unmodified part of the capillary structure has been optimized for phase-matched high harmonic generation, the corrugations may therefore adversely affect HHG generation. It may therefore be preferable to reduce or remove the presence of the gaseous medium in the corrugated section, so that only the drive radiation is modified and there is no detrimental coupling to the HHG radiation.

The example setups for separating radiation described above, use interference of drive radiation that has propagated through the capillary structure. It is alternatively or additionally possible to separate a portion of the drive radiation, before it couples into the capillary structure input end. This may be achieved by splitting the drive radiation beam before it is coupled into the capillary structure, so that a first portion of the drive radiation propagates through the capillary structure, and a second portion of the drive radiation bypasses the capillary structure. The first and second portions of the drive radiation may be interfered once the first portion has propagated through the capillary structure. The optical structure may comprise optical elements to split the drive radiation before the capillary structure, and to interfere the portions of radiation after the output end of the drive radiation.

A first option to propagate the second portion of drive radiation outside the capillary structure, may be to add a concentric, annular channel around the capillary structure. The concentric annular channel may form part of the optical structure, and may guide the second portion of the drive radiation. This may be illustrated in FIG. 10. In FIG. 10, first portion of drive radiation 1004 is coupled into the capillary structure 1002. Second portion of drive radiation 1006 is coupled into the concentric annular channel 1012 around the capillary structure. The first and second portions of the drive radiation may be combined 1010 after exiting from the capillary structure and annular channel. The combined drive radiation may form an annular beam in the far field. HHG radiation 1008 generated inside the capillary structure using the first portion of drive radiation 1004 may propagate along the optical axis and be spatially separated from the drive radiation 1010 in the far field.

The intensity distribution of drive radiation at the end of the combined capillary structure 1002 and concentric annular channel 1012 may be similar to that of the LP02 mode described above. However, in the implementation of FIG. 10, the central high-intensity region may be separated by the outer, annular high-intensity region by a material wall, in contrast to the LP02 mode in a single capillary structure or photonic crystal fiber described above. In this way, it may be sufficient to excite and sustaining the lower order LP01 mode in the capillary structure. This LP01 mode may be much easier to excite and sustain than a higher-order mode, such as for example an LP02 mode. By suitably designing the phase velocities of the propagating drive radiation 1004 and 1006 in the capillary structure 1002 and concentric annular channel 1012, their respective phases at the output end plane of the capillary structure may be chosen such that they result in destructive interference on the optical axis in the far field, i.e. generate an annular beam. Example conditions for achieving an annular beam in the far field are described in relation to equation 1.2 above.

The material of the concentric annular channel may be substantially the same as the material of the capillary structure. Control of the relative phase velocities in both capillary structure 10002 and concentric channel 1012 may be achieved by filling them with appropriate gaseous mediums. The gaseous mediums may be of different species and/or with different pressures in capillary 1002 and concentric channel 1012. The phase velocity may further be controlled by suitably choosing the wall materials and/or diameters of the capillary 1002 and/or concentric channel 1012.

In order to couple a sufficiently large fraction of the drive radiation into the concentric channel 1012, a fraction of the input beam may be focussed in a larger spot, or possibly in an annular shape, so that it covers both the input end of the capillary structure and the annular concentric channel. Focusing a part of the drive radiation beam in a larger spot may be achieved by splitting off a portion of the input drive radiation pulse using a beam splitter. Both portions of the split radiation may be focussed independently using different lenses, by using a beam shaping device such as for example a deformable mirror, a spatial light modulator, or by using a dual focus lens.

A second option to bypass the capillary structure with the second portion of the drive radiation uses optical elements to guide the radiation through free space. This idea is illustrated in FIG. 11. As stated above, function of the second portion 1106 of bypassing the capillary structure 1102 is to interfere with the first portion 1104 of drive radiation exiting 1110 from the capillary structure, in such a way that the interference is destructive on axis in the far field, and an annular laser beam is formed. This causes separation of the drive radiation 1110 and the HHG radiation 1108 in the far field. As shown in FIG. 11, the first portion 1104 of the laser beam may be focused onto the entrance of the capillary structure 1102 while the second portion 1106 may be directed around the capillary structure 1102. Options for splitting and manipulating both portions of the drive radiation beam are described in relation to FIG. 10 above, and may also be applied to a setup of FIG. 11. FIG. 11 shows an example setup of optical elements to recombine the first and second portions of drive radiation. The optical elements comprise a configuration of mirrors, namely an auxiliary annular mirror and a reflective exit face of the capillary. The bypassing second portion 1106 is recombined with the portion 1104 going through the capillary such that they may interfere destructively on the optical axis of the HHG radiation 1108 propagating out of the capillary structure 1102.

The concentric annular channel and the arrangement of mirrors described in relations to FIGS. 10 and 11 above are 2 example arrangements of optical elements for guiding and recombining the second portion of drive radiation with the first portion. Many other arrangements of optical elements are likely possible that enable the paths of the first and second portions to spatially recombine. In order to achieve interference, the pulses should be recombined to overlap not just in space, but also in time. Therefore, a further important criterion for any such configuration of optical elements may be that the path lengths of the first portion passing through the capillary structure and the second portion bypassing the capillary structure are equal to within an accuracy significantly smaller than the pulse length. If the path length difference between the first and second portions differs significantly in relation to the length of the pulse, the recombined portions would not overlap in time, making interference impossible. Designing the optical structure and capillary structure such that the recombined drive radiation portions overlap in space and time may be referred to as path length matching. Typical pulse lengths for HHG radiation may have an order of magnitude around 10 μm (i.e. a duration in the order of several tens of fs). Next to achieving overlap in space and time of the first and second portions of drive radiation upon recombination, the intensities of the first and second portions may also play a role. Preferably, the intensities should correspond to achieve destructive interference of the whole intensity of the affected first portion of drive radiation.

Another method for separating drive radiation from HHG radiation may make use of a Brewster plate. Brewster plates can significantly reduce reflection of radiation at an angle of incidence equal to the Brewster angle for a given polarisation. The Brewster plate may be effective for a limited range of wavelengths. In the context of this setup, the Brewster plate may be configured to operate in a wavelength range overlapping with the drive radiation wavelength(s). Although a single Brewster plate could be used by itself to limit the reduction in drive radiation intensity would be limited, and not sufficient for separating the drive radiation from the HHG radiation. Multiple Brewster plates could be used, however, this could also result in a significant reduction in intensity of the HHG radiation (which would be partially reflected, and partially transmitted by the Brewster plate). Further optical elements may be used in combination with a Brewster plate to increase the overall effectiveness of the optical structure separating the drive radiation and HHG radiation.

Figure 12:
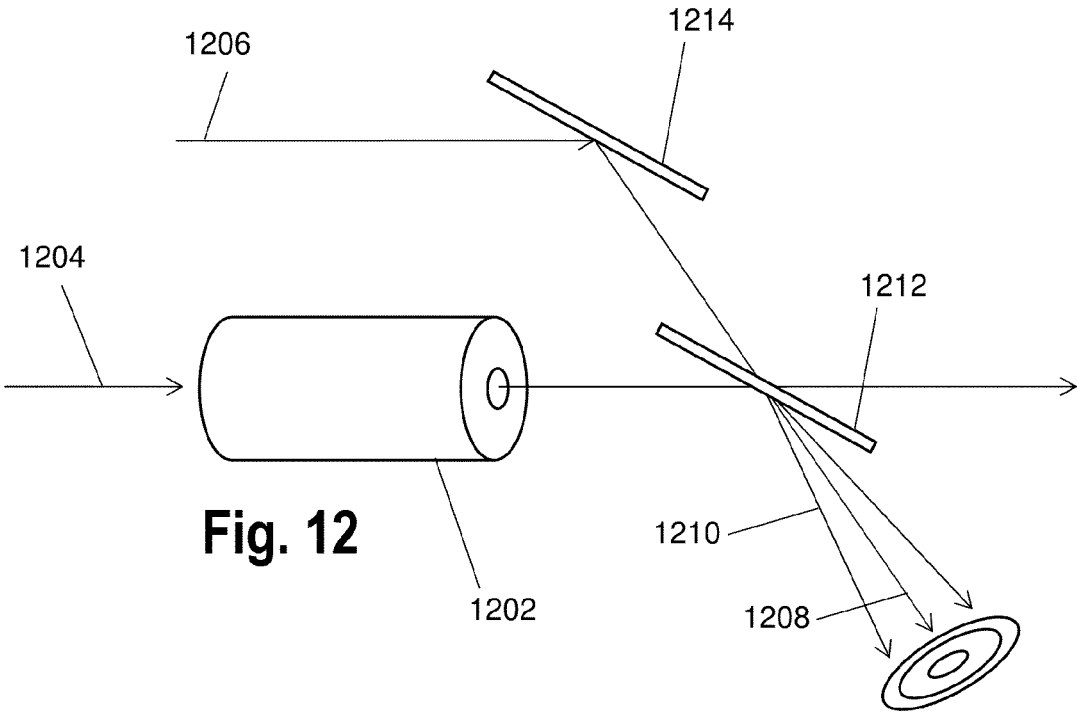
FIG. 12 depicts a schematic representation of an example setup for separating drive radiation and HHG radiation in the far field using a Brewster plate.

FIG. 12 depicts an example setup using a Brewster plate 1212 for separating drive 1210 and HHG 1208 radiation in the far field. The method may make use of first 1204 and second 1206 portions of drive radiation. Upstream of the capillary structure 1202, the drive radiation pulses may be split as detailed above. The first portion 1204 may be coupled into the capillary structure 1202 for HHG radiation 1208 generation, while the second portion 1206 may bypass the capillary structure 1202. Downstream of the capillary structure 1202, both portions may be recombined at the Brewster plate 1212. The Brewster plate 1212 may be set up to maximally supress the reflection of the first portion of drive radiation in the direction of the HHG radiation 1208. As the Brewster plate 1212 is selected to work for drive radiation wavelengths, reflection of the HHG radiation 1208 is not suppressed. Simultaneously, the second portion 1206 of drive radiation may be directed, using optical elements 1214 (e.g. mirrors) to irradiate the back side of the Brewster plate 1212, and be partially transmitted, so that it overlaps with the residual reflection of the first portion of drive radiation. As with other setups involving splitting and recombination of first and second portions of radiation, path length matching is important to achieve overlap in space and time to enable interference. The first and second portions may be recombined in such a way to from an annular beam of drive radiation 1210 in the far field, with its intensity separated from the optical axis of the HHG radiation 1208.

Next to separating a portion of the drive radiation from the HHG radiation, the Brewster plate 1212 may enable a lower intensity of second portion 1206 of drive radiation to be used. Because the Brewster plate 1212 suppresses reflection of the first portion of drive radiation, a lower amount of first portion is present at the point of recombination of the first and second portions of drive radiation 1210, downstream of the Brewster plate. The reduced power in the second portion allows for a larger fraction of the drive radiation to be split into the first portion of the drive radiation for HHG generation inside the capillary structure.

One potential concern may be that the first 1204 and second 1206 portions of drive radiation have different divergences, and therefore different wavefront curvatures, which may make destructive interference over the full radiation beam 1210 becomes difficult. However, if it occurs, this problem may be avoided by also introducing further optical elements as part of the optical structure, to provide a focus into the second portion. It may be sufficient to achieve destructive interference only in the part of the drive radiation 1210 overlapping with the HHG radiation 1208 after the output end of the capillary structure. This may be a central part of the drive radiation. Conveniently, achieving destruction only in a central part of the drive radiation 1210 may allow a reduction of required second portion 1206 of drive radiation.

Figure 13:
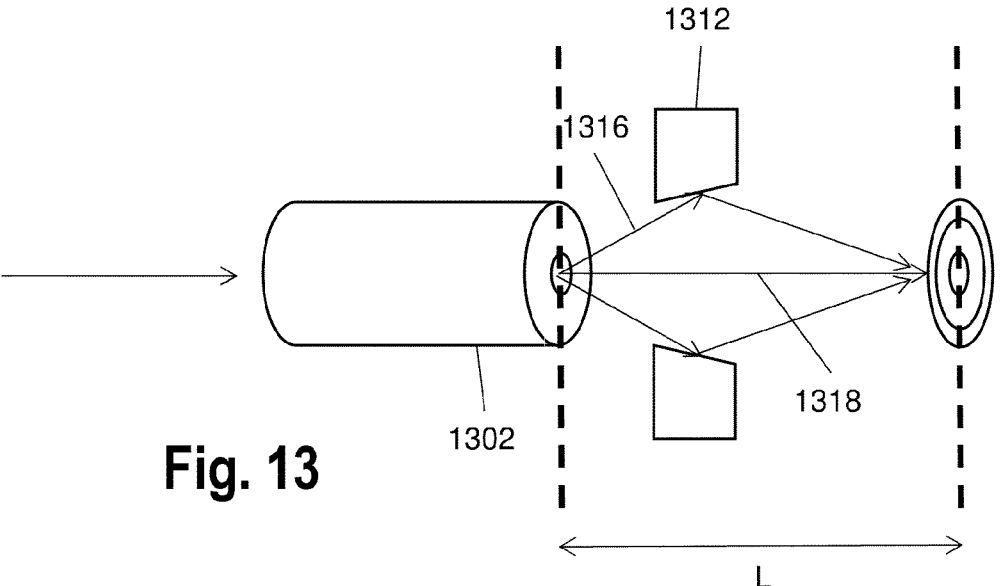
FIG. 13 depicts a schematic representation of an example setup for separating drive radiation an HHG radiation in the far field using a conical mirror

FIG. 13 depicts an example setup in which the optical structure comprises a conical mirror 1312, which may be used to achieve destructive interference of drive radiation along the optical axis of the HHG radiation. The interference may be between the drive radiation on the outside 1316 of the angular spread of the drive radiation beam, after it exits the capillary structure 1302, and the drive radiation in the centre 1318 of the beam. The conical mirror 1312 may be placed between the output end of the capillary structure and the aperture that is intended to block the separated drive radiation while allowing the HHG radiation to pass. The aperture may have a radius R and may be placed at a distance L from the exit of the capillary structure 1302. In this case, the radius h of the opening of the conical mirror 1312 may be not smaller than d*R/L, wherein d is the distance between the conical mirror and the exit of the capillary structure. If the opening h were to be smaller, the mirror would block parts of the HHG radiation which would be accepted by the aperture. Given this limitation on the dimensions of the opening of the conical mirror 1312, the path length difference S between a direct ray 1318 of drive radiation along the optical axis through the centre of the opening, and an indirect ray 1316 going from the exit of the capillary structure via the mirror to the centre of the aperture is, or approximately is:

$$S = \sqrt{d^2 + h^2} + \sqrt{(L-d)^2 + h^2} - (L-d) \geq \sim \frac{NA^2}{2} \frac{d/L}{1 - d/L}$$

Wherein NA=R/L is the numerical aperture. In the approximation, d. NA≤h≪d has been used. A requirement for this method to work may be that the path length difference S should be significantly smaller than the length of the pulse of drive radiation (in order of 10 μm for HHG sources). Otherwise, the pulses would not overlap in time and no interference would be possible. As the drive radiation is not split into first and second portions before it is coupled into the capillary, path length matching is only required between the direct 1318 and indirect 1316 rays passing through or hitting the conical mirror 1312.

For a typical NA of a few mrad, this condition may be satisfied when the conical mirror is close to the capillary structure exit, for example, at a few centimetres from the capillary structure exit, when the aperture is at a few tens of centimetres away. The conical mirror 1312 may be provided as a separate structure, or may be fabricated in a single part with the capillary structure 1302 itself. Achieving destructive interference may require finetuning of the optical path lengths to sub-wavelength accuracy. This may for example be accomplished by small movements of the mirror 1312 in the axial direction.

The example setups described above use interference effects to move intensity of the drive radiation away from the optical axis of the HHG radiation in the far field. The described setups provide annular beams and/or skewed beams so that the direction(s) of the drive radiation are different to the direction of the HHG radiation. Alternatively or additionally to these methods, it is possible to reduce the intensity of the drive radiation using diffraction mechanisms.

Figure 14:
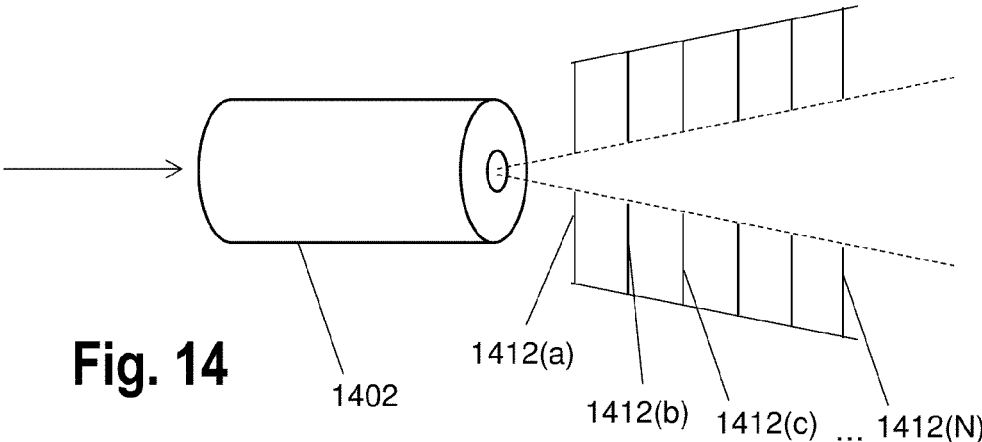
FIG. 14 depicts a schematic representation of an assembly for separating first radiation and second radiation using diffraction by a series of apertures.

FIG. 14 depicts an example implementation of an assembly for separating the drive radiation and HHG radiation, using diffraction. Drive radiation exiting from the capillary structure 1402 may be diffracted by a plurality of apertures 1412(*a*)-(N). Each diffraction step may diffract a portion of the drive radiation into an area between subsequent apertures. Instead of passing through the aperture, the portion of the radiation diffracted into the region between them is absorbed by the next aperture. As a result, the intensity of propagating drive radiation in each direction in reduced. The mechanism exploited by the diffracting apertures may comprise so-called knife edge diffraction. At each diffracting aperture a small part of the beam may be diffracted into the region between the current and next aperture, so that it will be blocked and absorbed by the next aperture. The diffraction angle around the edge of an aperture may typically be a few degrees, A few degrees may be significantly larger than the beam divergence of the drive radiation exiting from the capillary structure, which may typically be less than a few tenths of a degree.

In the setup of FIG. 14, N apertures 1412 may be placed at distances do from the capillary structure 1402. The radius rn of each of the apertures may satisfy the condition $r_n \geq Rd_n/L$, with R the radius of the final aperture and L the distance between the final aperture and the exit of the capillary structure (as described in relation to FIG. 13 above). This condition may be set to achieve that each aperture n does not block a part of the HHG radiation beam that would otherwise be accepted by the final drive radiation blocking aperture.

The presence of each aperture n may lead to a reduction of the propagating drive radiation beam power by diffracting a small part of the beam power into the shadow region between apertures (outside of the dashed lines in FIG. 14), so that subsequent apertures intercept and absorb the diffracted beam power.

By repeating this effect many (N) times, this arrangement may lead to significant reduction of the drive radiation power reaching the final aperture. The drive radiation power reduction may be higher, the more apertures 1412 are used. The apertures 1412 may or may not form a single assembly as is indicated in FIG. 14. The apertures 1412 may or may not be attached to the capillary structure and/or the final aperture (not shown). In an example setup, a series of 100 subsequent apertures spaced approximately 100 μm apart may achieve almost complete attenuation of the drive radiation beam. The number of apertures may be selected to achieve a desired level of attenuation of the drive radiation. The attenuation may for example be in a range of 10 to 1000 times.

It may be possible to replace the series of discrete apertures with a continuous conical absorber. A structured or diffuse surface may be provided as the grazing incidence surface for the conical absorber, in order to increase the rate of absorption.

Methods for intensity reduction of the pump/drive radiation can typically reduce the intensity by a factor in a range of 10×-1000×. However, the conversion efficiency of HHG sources may typically be in a range from 10-9 to 10-6. An aim of intensity reduction may be to reduce the intensity of the drive radiation at least below the intensity of the HHG radiation. In order to achieve this, multiple intensity reduction steps may be required. The multiple reduction step may comprise a combination of one or more of the intensity reduction steps described above. This may comprise for example a step of separating the drive radiation and the HHG radiation in the far field by giving them different directions. The setup may also comprise one or more of an aperture blocking the drive radiation, a wire mesh that preferentially transmits the HHG radiation, and/or other filters that (partially) block transmission of drive radiation (e.g. a zirconium (Zr) filter of a few 100 nm thick may be used to block IR drive radiation whilst transmitting significantly more HHG radiation).

Known drive radiation rejection schemes in HHG sources may involve a metal transmissive filter. This may be commonly placed at normal incidence in the beam path, which may also be referred to as perpendicular incidence to the optical axis of the radiation beam. In an example setup the drive radiation may be filtered by a hard circular aperture in the far field, after separation of the HHG radiation and drive radiation in the far field, for example using methods and assemblies described above. A fraction of drive radiation may remain overlapping with the HHG radiation in the far field. This is where a transmissive filter may be used to suppress (i.e. reflect and/or absorb) the drive radiation, while transmitting the HHG radiation. The transmissive filter may for example be a 400 nm thick Zr metal layer.

In this known configuration, the drive and HHG radiation are incident normal to the surface of the transmissive (Zr) filter. A problem with this setup may be that the filters may be damaged if the optical fluence is larger than the damage threshold of the Zr films. The damage threshold may be about 100 mW to 1 W for typical Zr filter sizes and thicknesses. This threshold may represents only 0.1% to 1% of the drive radiation power foreseen in a HHG illumination source suitable for high volume manufacturing (HVM) applications (e.g. using a 1 kW drive laser). Since this puts the damage threshold close or even below the residual drive radiation irradiance on the transmissive filter that can be expected in HVM tools, it may be beneficial to develop ways to support higher drive radiation irradiances.

To address the issue of improving the drive radiation damage threshold for the filter so that it may withstand higher incident intensities, proposed herein are features and methods for increasing the damage threshold of assemblies such as the ones described herein. The damage threshold may be increased in a range from 2 to 3 times. The choice of the transmissive filter thickness may be influenced by the damage threshold of the filter material (e.g. metal film, such as zirconium), and/or the level of drive radiation suppression to be achieved. Typically, thinner films may have a lower damage threshold. This may mean the filter thickness cannot be arbitrarily reduced, because of the low damage threshold, although a thin filter film may be sometimes desired in view of a higher HHG radiation transmission achieved by thinner films.

Figure 15:
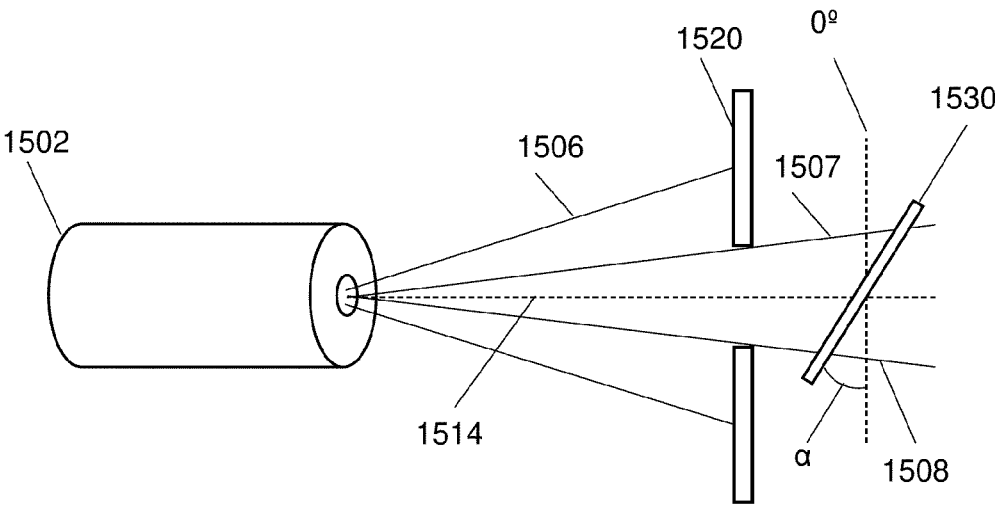
FIG. 15 depicts a schematic representation of an assembly for separating first radiation and second radiation comprising a tilted filter.

Provided herein is an assembly as depicted in FIG. 15. First radiation 1506 and second radiation 1508 may be output from a high harmonic generation setup such as a capillary structure 1502. The first radiation 1506 may be drive radiation and the second radiation 1508 may be HHG radiation. The first 1506 and second 1508 radiation may be partially separated in the far field. This may for example be achieved using an assembly as described above. An aperture 1520 may be placed in the far field, in order to block part of the drive radiation 1506. The aperture may be a circular aperture positioned around the optical axis 1514 of the HHG radiation to let it through. However, some of the drive radiation may also pass through the aperture 1520. Having passed through the aperture 1520, overlapping drive radiation and HHG radiation 1507 is present. In order to remove the drive radiation 1506 from the overlapping radiation 1507, a metal filter 1530, such as a zirconium filter, may be placed in the path of the overlapping radiation. The metal filter 1530 may have wavelength-dependent material properties, that mean the transmissivity of the filter is higher for the HHG radiation compared to the transmissivity for the drive radiation. After having passed through the filter 1530, the drive radiation component may have been substantially reduced.

As mentioned above, the metal filter may have a damage threshold in the region of the power intensity of the incident radiation, despite any previously applied intensity reduction elements. This may be due to absorption of the incident radiation by the material, leading to a high thermal load and consequent damage to the filter. In order to resolve this issue it is proposed herein to use the filter 1530 tilted at an angle α, as depicted in FIG. 15. For the avoidance of doubt. The non-tilted (0°-angle) position of the filter is considered to be a plane perpendicular to the optical axis 1514. Specifically, the non-tilted position may be considered perpendicular to the optical axis of the drive radiation. Positioning the filter 1530 at a tilt angle with respect to the drive and HHG radiation 1507 may increase the reflectance of the drive radiation, while keeping the HHG radiation transmission the same. Increasing reflection will reduce the thermal load in the filter material. Increased reflectance may also improve drive radiation suppression.

The amount of drive radiation reflected by the metal filter is angle dependent. For example, for s-polarized drive radiation at a wavelength of 1032 nm, the reflectivity of a zirconium filter may increase from about 40% to 75%, when the filter is move from a 0° (i.e. perpendicular to optical axis) to 70° tilt angle. The increased reflectivity may result in less drive radiation absorption by the filter. The drive radiation transmission though zirconium filter may be extremely small. Therefore, the drive radiation that is not reflected, is absorbed by the filter. As a result, when moving from 0 to 70 degree tilt angle, the amount of the drive radiation absorbed by the zirconium filter in the specific example of this paragraph, may change from around 60% to 25% of the incident drive radiation. This may reduce the thermal load on the Zr filter by a factor 2 to 3.

Figure 16:
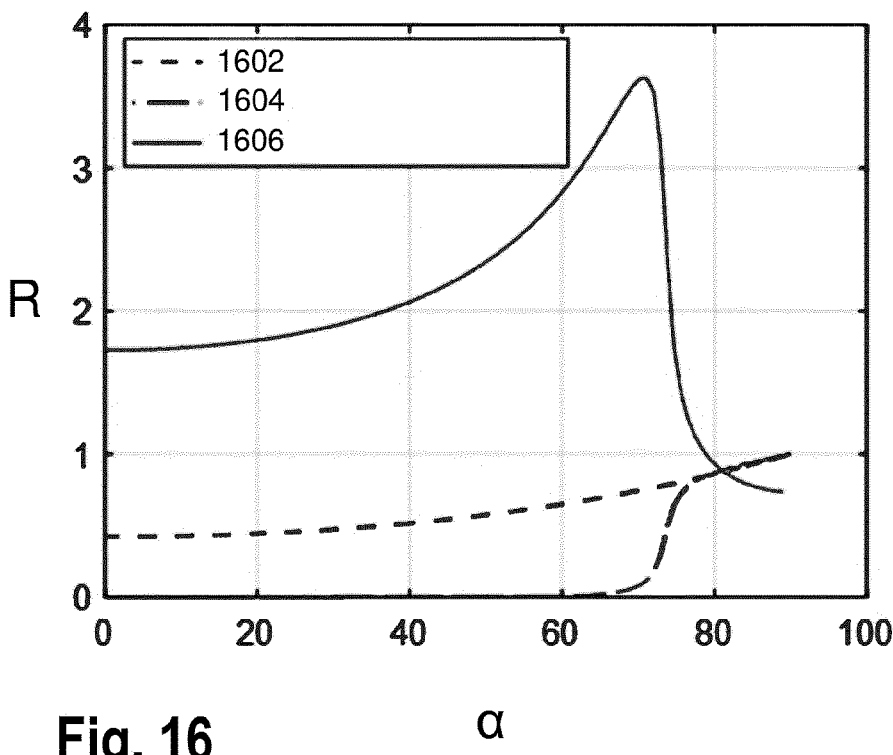
FIG. 16 depicts an example graph of filter reflectivity as a function of tilt angle.

FIG. 16 depicts an example graph of reflectivity R as a function of tilt angle α of a metal filter. Curve 1602 depicts reflectivity of drive radiation, and curve 1604 depicts reflectivity of HHG radiation. Curve 1606 is the reflection extinction ratio (ration between curve 1602 and curve 1604). The graph shows that a peak may be reached for high drive radiation reflection, while keeping HHG radiation reflection relatively low in comparison. To archive a relatively high extinction ration, the tile angle is within 0 to 70 degree, optionally within 10 to 70 degree, optionally within 20 to 70 degree, optionally within 30 to 70 degree, optionally within 40 to 70 degree, optionally within 50 to 70 degree, optionally within 55 to 70 degree, optionally within 60 to 70 degree, optionally within 65 to 70 degree, and optionally 70 degree.

A disadvantage of metal filters may be that they not only extinct the drive radiation, but may also significantly absorb the desired HHG radiation to be output by the assembly. For example, a 400 nm zirconium filter may absorb up to 75% of the HHG radiation light. This may be considered a severe HHG radiation power penalty. Therefore, it may be desirable to provide a filter having increased HHG radiation transmission.

It is possible to use the advantage of a tilted filter for increased HHG transmission. Instead of keeping the same metal filter and increasing reflectance of drive radiation by introducing a tilt angle as described above, it is possible to use the same tilting angle, while reducing the thickness of the filter. This reduced thickness may increase the HHG radiation transmission through the filter, while keeping the drive radiation suppression the same. By introducing a tilt angle and reducing the thickness to keep the same drive radiation suppression, the HHG radiation transmission may be increased by about 15%.

Figure 17:
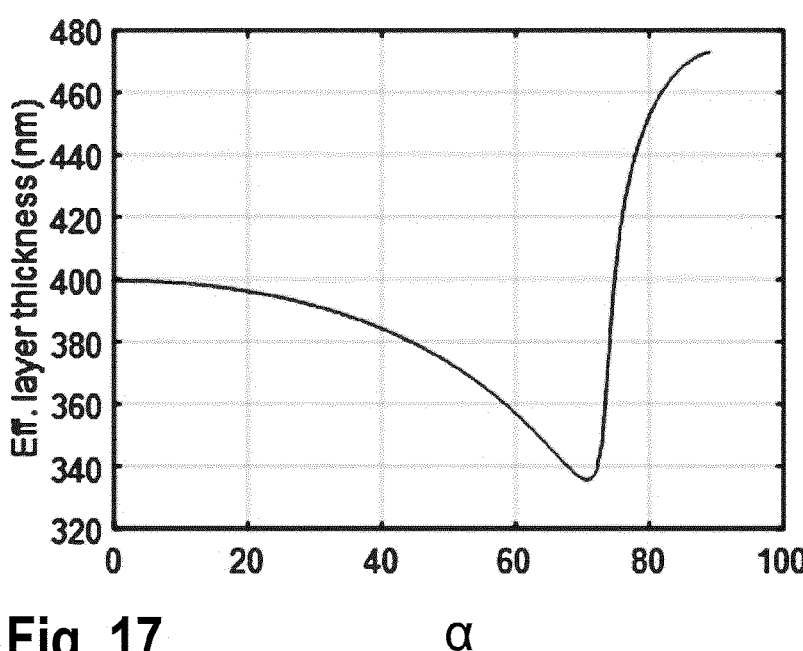
FIG. 17 depicts an example graph of effective layer thickness as a function of tilt angle.

FIG. 17 depicts an example graph of (effective) filter layer thickness needed to achieve the same drive radiation suppression as a non-tilted filter, as a function of tilt angle of the filter. The effective filter thickness of a non-tilted zirconium filter that is 400 nm thick (tilt angle α=0) is depicted as a curve in FIG. 17. It can be seen from the graph that a 340 nm thick zirconium filter tilted at 70° may achieve the same drive radiation suppression as a 400 nm thick non-tilted zirconium filter. The example of FIG. 17 may account for a reflection at a vacuum-zirconium filter interface, absorption while propagating through the filter, and reflection at the zirconium-vacuum interface.

Figure 18:
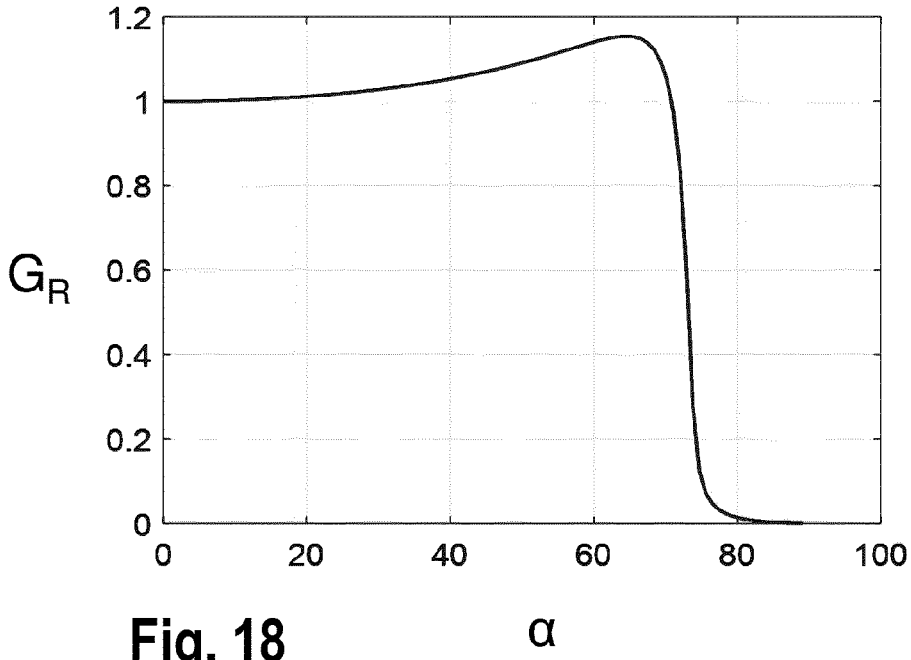
FIG. 18 depicts an example graph of HHG radiation transmission gain as a function of tilt angle.

If a (tilted) metal filter with a decreased thickness is used, the HHG radiation transmission through the filter may increase as a result. FIG. 18 depicts an example graph of the relative gain in HHG radiation transmission as a function of tilt angle, where the thickness has been reduced to achieve the same drive radiation reflection, as depicted in FIG. 17. It can be seen that the HHG radiation transmission may increase by 15% as a result. Since high HHG source power output is a desirable and advantageous outcome for high volume manufacturing metrology applications based on XUV or SXR radiation (or other HHG radiation described herein), this may be an advantage of using reduced thickness tilted metal filters.

The example thicknesses and percentages provided above relate to a Zr filter. However, in view of the similar optical properties of metals or other materials, similar effect may be achieved for filters made from other metals or other materials, such as for example Ag, Al, Si, etc. which are other used filter materials in HHG sources. The filter may also be made of alloy of the above listed metals or multiple sublayers of different materials e.g. two or more combinations of Zr, Al, Si, Ag, etc.

In cases where the damage threshold of the metal filter is not a deciding factor of the filter thickness, multiple thinner filters may be used in series. Each filter in the series may have the same tilt angle. As a result, the number of metal-vacuum and vacuum-metal interfaces increases and therefore, the amount of drive radiation reflected from those surfaces may also increase. Hence, the same level of drive radiation suppression may be achieved with less total filter layer thickness, and thereby an additional increase in HHG radiation transmission may be achieved.

Alternatively and/or additionally to the improvement in HHG transmission and reduction in thermal load, the tilted filter configuration may be useful for HHG radiation pulse energy control and spectral reference measurement. In known metrology tools, reference gratings may be used. These reference gratings may have a disadvantage in that they may have a significant impact on the HHG beam quality. This may be because the HHG beam quality, which may comprise short wavelengths, may be very sensitive to surface imperfections on any of the HHG optics. This may lead to tight nm-scale tolerances for surface smoothness of the optics used for the reference grating. However, the fabrication process of the grating lines in reference gratings may lead to some surface roughness, which easily surpasses these tight tolerances. Additionally, development and fabrication of a sufficiently smooth grating on the very high-quality HHG radiation compatible mirrors represents a major cost contributors of the metrology tool. It is proposed herein to address these challenges by using the metal filter in the assembly to monitor the source power and spectrum of the HHG radiation. This may avoid the use of a reference grating, and thereby the corresponding cost and penalty on HHG beam quality.

As illustrated in FIG. 16, increasing the angle of the metal filter beyond a certain tilt angle (for zirconium, beyond around 70° tilt angle) may lead to increase in HHG radiation reflection as well. It is possible to tune the angle so that it set such that a small fraction of the HHG radiation power is reflected. The reflected HHG radiation may be sent to a HHG radiation spectrometer. This may allow in-situ spectrum measurement and/or source power calibration during use of the source, for example in a metrology application. The temporal fluctuations observed in source power and/or source spectrum may for example be used to correct the measurement results of the metrology tool. This may lead to significant improvements in accuracy and sensitivity range of the tool. Furthermore, this setup may allow to avoid the usage of a reference grating in the HHG radiation beam path. This avoidance of a reference grating may lead to a significant cost reduction of the HHG source optics, as well as improvement of the HHG radiation beam quality.

In the assemblies comprising a metal filter described herein, the HHG radiation is transmitted through the filter. When the filter is tilted at an angle, the path length of the HHG radiation through the filter will increase as the tilt angle is increased. As a result, when the tilt angle is increased, the HHG radiation attenuation also increases. This may be because a portion of the HHG radiation is absorbed as it propagated through the filter material. This angle-dependent attenuation may be used as a dynamic way to control the dose of HHG radiation output by the assembly/source, without affecting the HHG process itself. The filter angle may be modulated in-situ, for example using a control and/or feedback loop. This dynamic dose control may enable accurate stabilization of the HHG radiation output power against any fluctuations. Fluctuations may for example be induced by the drive laser, and/or the gas target system. When provided inside a metrology tool, the performance of the metrology tool may be improved.

The methods and assemblies including a tilted filter as described herein may be used in combination with an optical assembly such as the capillary structure HHG setup described herein. The tilted filter assembly for reducing the damage threshold of the filter as described herein may also be used in alternative HHG setups, such as for example a gas jet HHG setup as shown in FIG. 6, and gas cell HHG setup with a sealed gas volume. The tilted filter assembly may also be used in any other setup in which first and second overlapping radiation are to be separated, by providing a filter material that has the required reflective and transmissive properties for the relevant first and second wavelengths/wavelength ranges.

The methods and assemblies including a tilted filter as described herein may be used in combination with a lithographic apparatus, for example a lithographic apparatus using extreme ultraviolet (EUV) radiation as described above, or with a EUV lithographic source. The tilted filter assembly may be used to separate radiations with different wavelengths used in a lithographic apparatus or a lithographic source. One embodiment is that using the tilted filter assembly to separate a pump radiation, which hits a liquid metal medium, and the metal-medium-generated EUV radiations.

The drive radiation described herein may comprise infrared (IR) radiation comprising one or more wavelengths ranging approximately from 700 nm to 10 μm, visible radiation comprising one or more wavelengths ranging approximately from 400 nm to 700 nm, and/or ultraviolet (UV) radiation comprising one or more wavelengths ranging approximately from 200 nm to 400 nm. The drive radiation may comprise a combination of any of the above.

The HHG radiation described herein may comprise one or more wavelengths in a range from 1 nm to 180 nm. The HHG radiation may for example comprise wavelength(s) in a range from 1 nm-10 nm, 10 nm-100 nm, and/or 100 nm-180 nm.

The capillary structure described herein may be filled, in use, with a gaseous medium for achieving high harmonic generation. The gaseous medium may comprise one or more of H2, Ne, He, Ar, N2, O2, Kr, Xe. Further details of the use of the assemblies described herein are provided in relation to FIGS. 5 and 6.

The assemblies described herein may be provided as a radiation source for providing HHG radiation. The radiation source may be used as an illumination source. The illumination source may be provided in for example a metrology apparatus MT, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Further embodiments are disclosed in the subsequent list of numbered clauses:

1. An assembly for separating first radiation and second radiation in the far field, wherein the first radiation and the second radiation have non-overlapping wavelengths, the assembly comprising:

a capillary structure, wherein the first radiation and the second radiation propagate coaxially along at least a portion of the capillary structure; and an optical structure configured to control the spatial distribution of the first radiation outside of the capillary structure, through interference, such that the intensity of the first radiation in the far field is reduced along an optical axis of the second radiation.

2. An assembly according to clause 1, wherein the optical structure is configured to cause interference of the first radiation such that it forms an annular beam.

3. An assembly according to any of the preceding clauses, wherein the optical structure is provided in a portion of the capillary structure for guiding the first radiation and the second radiation.

4. An assembly according to clause 3, wherein the optical structure is located in an end section located towards an output end of the capillary structure 5. An assembly according to any of clauses 3-4, wherein controlling the spatial distribution in the far field comprises:

selecting the properties of at least one of a material and a shape of the optical structure so as to support the propagation of modes of the first radiation having a distribution where an average of the electric field is zero over a cross-section of the capillary structure.

6. An assembly according to any of clauses 3-5, wherein the optical structure comprises a Bragg grating configured to reflect the first radiation in a direction away from the output end of the capillary structure.

7. An assembly according to clause 6, wherein the Bragg grating is a gradual Bragg grating.

8. An assembly according to any of the preceding clauses, wherein the optical structure comprises a corrugated section added after an output end of the capillary structure.

9. An assembly according to any of the preceding clauses, wherein the optical structure comprises one or more optical elements configured to:

split the first radiation before it enters the capillary structure, such that a first portion of first radiation propagates through the capillary structure, and a second portion of first radiation bypasses the capillary structure; and interfere the first and second portions of first radiation once the first portion has propagated through the capillary structure.

10. An assembly according to clause 9, wherein the one or more optical elements comprise an annular structure around the capillary structure configured to guide the second portion of first radiation bypassing the capillary structure.

11. An assembly according to any of clauses 9-10, wherein the one or more optical elements are arranged such that a path length of the first portion of first radiation and the second portion of the first radiation match at the location where they interfere.

12. An assembly according to any of the preceding clauses, wherein the optical structure comprises a Brewster plate configured to suppress reflection of the first radiation while reflecting at least a portion of the second radiation.

13. An assembly according to any of the preceding clauses, wherein the optical structure comprises a conical mirror located in the path of the first radiation after it exits the capillary structure, wherein the conical mirror is configured such that the first radiation interferes destructively with itself along an optical axis of the second radiation.

14. An assembly according to clause 1, wherein the optical structure causes interference of the first radiation such that it diffracts into a direction which is different from the optical axis of the second radiation.

15. An assembly for separating first radiation and second radiation in the far field, wherein the first radiation and second radiation have non-overlapping wavelengths, the assembly comprising: a capillary structure, wherein the first radiation and the second radiation propagate coaxially along at least a portion of the capillary structure; and an optical structure configured to control the spatial distribution of the first radiation outside of the capillary structure, through diffraction, such that the intensity of the first radiation in the far field is reduced along an optical axis of the second radiation.

16. An assembly according to clause 15, wherein the optical structure comprises a series of diffracting apertures configured to absorb portions of the first radiation diffracted into the regions between the diffracting apertures such that the intensity in the far field is reduced by a factor in a range from 10 to 1000.

17. An assembly according to any of the preceding clauses, wherein the capillary structure is configured to:

receive the first radiation, at an input end of the capillary structure; and generate, using the first radiation as drive radiation, the second radiation using high harmonic generation.

18. An assembly according to any of the preceding clauses, wherein the capillary structure comprises a hollow core fibre configured to hold a gas medium.

19. An assembly according to any of the preceding clauses, wherein the gas medium comprises at least one of H2, Ne, He, Ar, N2, O2, Kr, Xe.

20. An assembly for separating first radiation and second radiation in the far field, wherein the first radiation and the second radiation have non-overlapping wavelengths, the assembly comprising:

a tilted metal filter configured to receive incident overlapping first radiation and second radiation, wherein the filter has a lower transmissivity for the first radiation than for the second radiation; and wherein the filter has a tilt angle relative to a perpendicular plane to the optical axis of the first radiation such that the tilted filter has an increased reflectivity of first radiation compared to an angle parallel to the perpendicular plane.

21. An assembly according to clause 20, wherein the tilt angle is in a range from 10-70 degrees to the perpendicular plane.

22. An assembly according to clause 21, wherein the tilt angle is selected to be the angle in the range that achieves the highest reflection of first radiation 23. An assembly according to any of clauses 20-22, wherein the reflectivity of the tilted filter for the first radiation is in a range from 40%-75%.

24. An assembly according to any of clauses 20-23, wherein the metal is zirconium.

25. An assembly according to any of clauses 20-23, wherein the metal is one of silver, aluminium.

26. An assembly according to any of clauses 20-25, wherein the tilted filter also increases reflectivity of the second radiation, and wherein the assembly further comprises:

a detector configured to capture reflected second radiation; and a spectrometer configured to perform a spectral measurement of the captured second radiation.

27. An assembly according to clause 26, wherein the spectrometer is further configured to perform a power measurement of the captured second radiation.

28. An assembly according to any of clauses 20-27, wherein the assembly is configured to modulate the tilt angle of the filter for controlling the amount of transmissivity of second radiation.

29. An assembly according to any of clauses 20-28, wherein the titter filter comprises a plurality of tilted filters positioned in series.

29. An assembly according to any of clauses 20-28, wherein the assembly is comprises the features of an assembly according to any of clauses 1-19.

30. An assembly according to any of the preceding clauses, wherein the second radiation comprises radiation with one or more wavelengths in a range from 1 nm-180 nm.

31. An assembly according to any of the preceding clauses, wherein the first radiation comprises radiation with one or more wavelengths in a range of 200 nm to 10 μm.

32. A radiation source comprising an assembly according to any of the preceding clauses.

33. A lithographic apparatus comprising a radiation source according to clause 32.

34. A metrology apparatus comprising a radiation source according to clause 32.

35. A litho cell comprising a radiation source according to clause 32.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range below 0.1 nm, optionally below 0.01 nm, or between 0.01 nm and 10 nm, or optionally between 0.01 nm and 1 nm, or optionally between 0.01 nm and 0.1 nm, for metrology measurements.

Although specific reference is made to metal filter, it will be appreciated that the invention, where the context allows, may be practiced with filter with other types of materials with suitable optical properties such as Silicon.

While specific embodiments have been described above, it will be appreciated that one or more of the features in one embodiment may also be present in a different embodiment and that features in two or more different embodiments may also be combined.

The invention claimed is:

1. An assembly for separating first radiation and second radiation in the far field, wherein the first radiation and the second radiation have non-overlapping wavelengths, the assembly comprising:
   a capillary structure, wherein the first radiation and the second radiation propagate coaxially along at least a portion of the capillary structure and an optical axis of the second radiation; and
   an optical structure configured to control a spatial distribution of the first radiation outside of the capillary structure, through interference or diffraction, such that an intensity of the first radiation in the far field is reduced along the optical axis and is substantially separated from the second radiation in the far field while the second radiation continues to propagate along the optical axis.

2. The assembly of claim 1, wherein the capillary structure is configured to:
   receive the first radiation, at an input end of the capillary structure; and generate, using the first radiation as drive radiation, the second radiation.

3. The assembly of claim 1, wherein the capillary structure is configured to generate, using the first radiation as drive radiation, the second radiation using high harmonic generation.

4. The assembly of claim 1, wherein the optical structure is configured to cause interference of the first radiation such that it forms an annular beam.

5. The assembly of claim 1, wherein the optical structure is provided in a portion of the capillary structure and is configure to guide the first radiation and the second radiation, and wherein the optical structure is located in an end section located towards an output end of the capillary structure.

6. An assembly of claim 5, wherein at least one of:
   controlling the spatial distribution in the far field comprises: selecting the properties of at least one of a material and a shape of the optical structure so as to support the propagation of modes of the first radiation having a distribution where an average of the electric field is zero over a cross-section of the capillary structure, and
   the optical structure comprises a Bragg grating configured to reflect the first radiation in a direction away from the output end of the capillary structure.

7. The assembly of claim 1, wherein the optical structure comprises a corrugated section disposed after an output end of the capillary structure.

8. The assembly of claim 1, wherein the optical structure comprises one or more optical elements configured to:
   split the first radiation before it enters the capillary structure, such that a first portion of the first radiation propagates through the capillary structure, and a second portion of the first radiation bypasses the capillary structure; and
   interfere the first and second portions of the first radiation once the first portion has propagated through the capillary structure.

9. The assembly of claim 8, wherein the one or more optical elements comprise an annular structure disposed around the capillary structure and configured to guide the second portion of the first radiation bypassing the capillary structure.

10. The assembly of claim 8, wherein the one or more optical elements are arranged such that a path length of the first portion of the first radiation and the second portion of the first radiation match at the location where they interfere.

11. The assembly of claim 1, wherein the optical structure causes interference of the first radiation such that it diffracts into a direction that is different from the optical axis of the second radiation.

12. The assembly of claim 1, wherein the optical structure comprises a series of diffracting apertures configured to absorb portions of the first radiation diffracted into the regions between the diffracting apertures such that the intensity in the far field is reduced by a factor in a range from 10 to 1000.

13. An assembly of claim 1, further comprising:
   a tilted filter configured to receive incident overlapping the first radiation and the second radiation, wherein the tilted filter has a lower transmissivity for the first radiation than for the second radiation; and
   wherein the tilted filter has a tilt angle relative to a perpendicular plane to the optical axis of the first radiation such that the tilted filter has an increased reflectivity of the first radiation compared to an angle parallel to the perpendicular plane.

14. A radiation source comprising an assembly of claim 1.

15. A metrology apparatus comprising a radiation source of claim 14.

* * * * *